United States Patent
Kan et al.

(10) Patent No.: US 7,259,984 B2
(45) Date of Patent: Aug. 21, 2007

(54) MULTIBIT METAL NANOCRYSTAL MEMORIES AND FABRICATION

(75) Inventors: Edwin C. Kan, Ithaca, NY (US); Zengtao Liu, Sunnyvale, CA (US); Chungho Lee, Ithaca, NY (US)

(73) Assignee: Cornell Research Foundation, Inc., Ithaca, NY (US)

( * ) Notice: Subject to any disclaimer, the term of this patent is extended or adjusted under 35 U.S.C. 154(b) by 88 days.

(21) Appl. No.: 10/718,662

(22) Filed: Nov. 24, 2003

(65) Prior Publication Data
US 2004/0130941 A1    Jul. 8, 2004

Related U.S. Application Data

(60) Provisional application No. 60/428,906, filed on Nov. 26, 2002.

(51) Int. Cl.
*G11C 11/34* (2006.01)
(52) U.S. Cl. ............. 365/177; 365/185.01; 365/185.18
(58) Field of Classification Search ................ 365/177, 365/185.01, 185.03, 189.01, 185.18; 257/324, 257/E51.04
See application file for complete search history.

(56) References Cited

U.S. PATENT DOCUMENTS

| | | | |
|---|---|---|---|
| 5,559,057 A | 9/1996 | Goldstein | |
| 5,679,171 A | 10/1997 | Saga et al. | |
| 6,090,666 A | 7/2000 | Ueda et al. | |
| 6,128,214 A | 10/2000 | Kuekes et al. | |
| 6,141,256 A * | 10/2000 | Forbes | 365/185.01 |
| 6,172,905 B1 | 1/2001 | White et al. | |
| 6,320,784 B1 | 11/2001 | Muralidhar et al. | |
| 6,400,610 B1 * | 6/2002 | Sadd | 365/185.29 |
| 6,434,053 B1 * | 8/2002 | Fujiwara | 365/185.03 |
| 6,472,705 B1 | 10/2002 | Bethune et al. | |
| 6,643,165 B2 | 11/2003 | Segal et al. | |
| 6,768,165 B1 * | 7/2004 | Eitan | 257/324 |
| 6,831,310 B1 * | 12/2004 | Mathew et al. | 257/270 |
| 6,992,349 B2 * | 1/2006 | Lee et al. | 257/324 |

OTHER PUBLICATIONS

J.R. Tucker, "Schottky barrier MOSFETs for Silicon nanoelectronics," Advanced Workshop on Frontiers in Electronics, WOFE'97 Proceedings, pp. 97-100, 1997.
C. Wang, J.P. Snyder and J.R. Tucker, "Sub-40 nm PtSi Schottky source/drain metal-oxide-semiconductor field-effect transistors," Appl. Phys. Lett, vol. 74, pp. 1174-1176, 1999.

(Continued)

*Primary Examiner*—David Lam
(74) *Attorney, Agent, or Firm*—Jones, Tullar & Cooper, P.C.

(57) ABSTRACT

Metal nanocrystal memories are fabricated to include higher density states, stronger coupling with the channel, and better size scalability, than has been available with semiconductor nanocrystal devices. A self-assembled nanocrystal formation process by rapid thermal annealing of ultra thin metal film deposited on top of gate oxide is integrated with NMOSFET to fabricate such devices. Devices with Au, Ag, and Pt nanocrystals working in the F-N tunneling regime, with hot-carrier injection as the programming mechanism, demonstrate retention times up to $10^6$s, and provide 2-bit-per-cell storage capability.

7 Claims, 28 Drawing Sheets

Nanocrystal Memory

OTHER PUBLICATIONS

V. Narayanan, Z. Liu, Y.M.N. Shen, M. Kim and E.C. Kan, "Reduction of metal-semiconductor contact resistance by embedded nanocrystals," IEDM Tech. Dig., pp. 87-90. 2000.

E.C. Kan and Z. Liu, "Directed self-assembly process for nano-electronic devices and interconnect," Superlattices and Microstructures, vol. 27, pp. 473-479, 2000.

Z. Liu, M. Kim, V. Narayanan, and E.C. Kan, "Process and device characteristics of self-assembled metal nano-crystal EEPROM," Superlattices and Microstructures, vol. 28, pp. 393-399. 2000.

Z. Suo and Z. Zhang, Epitaxial films stabilized by long range forces, Phys. Rev. B, vol. 58, pp. 5116-5120, 1998.

D.A. Bonnell, Y. Liang, M. Wagner, D. Carroll and M. Buhle, "Effect of size dependent interface properties on stability of metal clusters on ceramic substrates," Acta Mater., vol. 46, pp. 2263-2270, 1998.

Z. Liu, V. Narayanan, M. Kim, G. Pei and E.C. Kan, "Low programming voltages and long retention time in metal nanocrystal EEPROM devices," 59th DRC Tech. Dig., pp. 79-80, 2001.

H.C. Lin, E.C. Kan, T. Yamanaka & C.R. Helms, "Modeling and characterization of Si/SiO2 interface roughness," VLSI Tech. Symp., Kyoto, Japan, Jun. 1997.

J. Kedzierski, P. Xuan, E.H. Anderson, J. Bokor, T.J. King and C. Hu, "Complementary silicide source/drain thin-body MOSFETs for the 20nm gate length regime," IEDM Tech. Dig., pp. 57-60, 2000.

J. Kedzierski, P. Xuan, V. Subramanian, E.H. Anderson, J. Bokor, T.J. King and C. Hu, "A 20-nm gate-length ultra-thin body p-MOSFET with silicide source/drain," Si Nanoelectronics Workshop, VLSI Tech. Symp., pp. 13-15, Honolulu, Hawaii, Jun. 2000.

C. Diorio, P. Hasler, B.A. Minch and C.A. Mead, "A floating-gate MOS learning array with locally computed weight updates," IEEE Trans. Electron Devices, vol. 44, pp. 2281-2289, 1977.

"The Evolution of Dram Cell Technology," B. El-Kareh, G.B. Bronner; Solid State Technology, May 1997, vol. 40, Issue 5.

"Fast and Long Retention-Time Nano-Crystal Memory," H.I. Hanafi, S. Tiwari, I. Khan; IEEE Transactions on Electron Devices, vol. 43, No. 9, Sep. 1996.

"Charge-Trap Memory Device Fabricated by Oxidation of $Si_{1-x}Ge_x$," Y-C King, T-J King, C. Hu; IEEE Transactions on Electron Devices, vol. 48, No. 4, Apr. 2001.

"A Long-Refresh Dynamic/Quasi-Nonvolatile Memory Device with 2-nm Tunneling Oxide," Y-C King, T-J King, C. Hu; IEEE Electron Device Letters, vol. 20, No. 8, Aug. 1999.

"NROM: A Novel Localized Trapping, 2-Bit Nonvolatile Memory Cell," B. Eitan, P. Pavan, I. Bloom, E. Aloni, A. Frommer, D. Finzi; IEEE Electron Device Letters, vol. 21, No. 11, Nov. 2000.

"A Low Voltage SONOS Nonvolatile Semiconductor Memory Technology," M.H. White, Y. Yang, A. Purwar, M.L. French; IEEE Transactions on Components, Packaging, and Manuf. Tech.-Part A, vol. 20, No. 2, Jun. 1997.

"High-Endurance Ultra-Thin Tunnel Oxide in MONOS Device Structure for Dynamic Memory Application," H.C. Wann, C. Hu; IEEE Electron Device Letters, vol. 16, No. 11, Nov. 1995.

"Programming Characteristics of P-Channel Si Nano-Crystal Memory," K. Han, I. Kim, H. Shin; IEEE Electron Device Letters, vol. 21, No. 6, Jun. 2000.

"A Novel, aerosol-nanocrystal floating-gate device for non-volatile memory applications," J. DeBlauwe, M. Ostraat, M.L. Green, G. Weber, T. Sorsch, A Kerber, F. Klemens, et al.; 2000 IEEE.

"Single-Electron Devices and Their Applications," K.K. Likharev; Proceedings of the IEEE, vol. 87, No. 4, Apr. 1999.

"Non-Volatile Si Quantum Memory with Self-Aligned Doubly-Stacked Dots," R. Ohba, N. Sugiyama, K. Uchida, J. Koga, A. Toriumi; IEEE 2000.

"Modification of Indium Tin Oxide for Improved Hole Injection in Organic Light Emitting Diodes," Y. Shen, D.B. Jacobs, G.G. Malliaras, G. Koley, M.G. Spencer, A. Ioannidis; Adv. Mater, 2001, No. 16, Aug. 16.

"Room Temperature Operation of a Quantum-Dot Flash Memory," J.J. Welser, S. Tiwari, S. Rishton, K.Y. Lee, Y. Lee; IEEE Electron Device Letters, vol. 18, No. 6, Jun. 1997.

"Silicon Nano-Crystals Based MOS Memory and Effects of Traps on Charge Storage Characteristics," Y. Shi, S.L. Bu, X.L. Yuan, Y.D. Zheng; K. Saito, H. Ishikuro, T. Hiramoto; IEEE 1998.

"A High Capacitive-Coupling Ratio (HiCR) Cell for 3 V-Only 64 Mbit and Future Flash Memories," Y.S. Hisamune, K. Kanamori, T. Kubota, Y. Suzuki, M. Tsukiji, E. Hasegawa, A. Ishitani, T. Okazawa, IEEE 1993.

"Volatile and Non-Volatile Memories in Silicon with Nano-Crystal Storage," S. Tiwari, F. Rana, K. Chan, H. Hanafi, W. Chan, D. Buchanan; 1995 IEEE.

"Multilevel FLash cells and their Trade-offs," B. Eitan, R. Kazerounian, A. Roy; G. Crisenza, P. Cappelletti, A. Modelli; 1996 IEEE.

"Modeling and Design Study of Nanocrystal Memory Devices," M. She, Y-C King, T-J King, C. Hu; Dept. of Elect. Eng. and Comp. Sciences, U. of C., Berkely, CA.

"A Four-State EEPROM Using Floating-Gate Memory Cells," C. Bleiker, H. Melchior; IEEE Journal of Solid-State Circuits, vol. SC-22, No. 3, Jun. 1987.

"A Multilevel Approach Toward Quadrupling the Density of Flash Memory," D.L. Kencke, R. Richart, S. Garg, S.K. Banerjee; IEEE Electron Device Letters, vol. 19, No. 3, Mar. 1998.

"Data Retention of a SONOS Type-Two-Bit Storage Flash Memory Cell," W.J. Tsai, N.K. Zous, C.J. Liu, C.C. Liu, C.H. Chen, T. Wang, S. Pan, C-Y Lu; S.H. Gu; 2001 IEEE.

"A Novel Approach to Controlled Programming of Tunnel-Based Floating-Gate MOSFET's," M. Lanzoni, L. Briozzo, B. Ricco; IEEE Jrnl. of Solid-State Circuits, vol. 29, No. 2, Feb. 1994.

"On the Universality of Inversion Layer Mobility in Si MOSFET's: Part I-Effects of Substrate Impurity Concentration," S-i Takagi, A. Toriumi, M. Iwase, H. Tango; IEEE Transactions on Electron Devices, vol. 41, No. 12, Dec. 1994.

\* cited by examiner

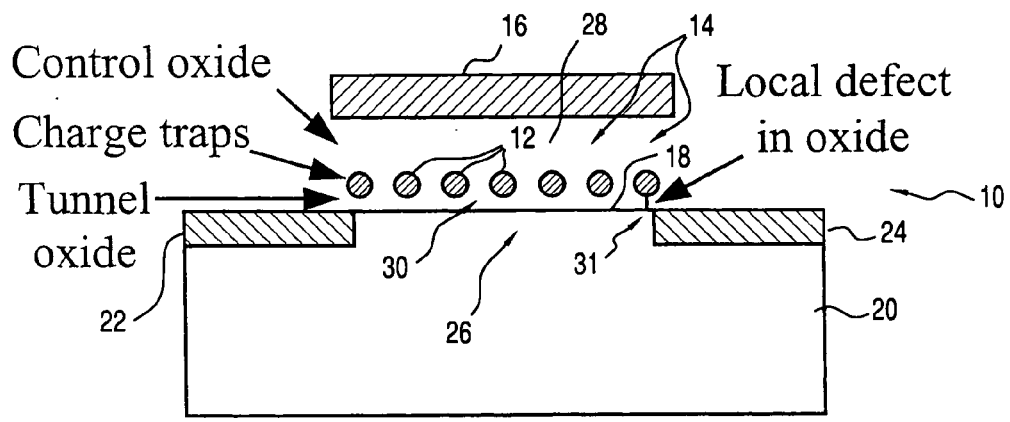
FIG. 1(a)
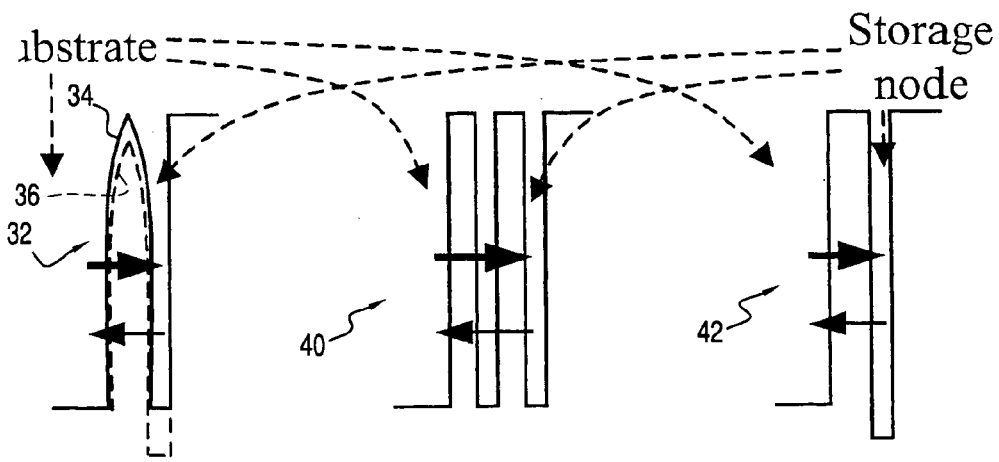
Dielectric Engineering
FIG. 1(b)
Double-stack storage nodes
FIG. 1(c)
Work function Engineering
FIG. 1(d)

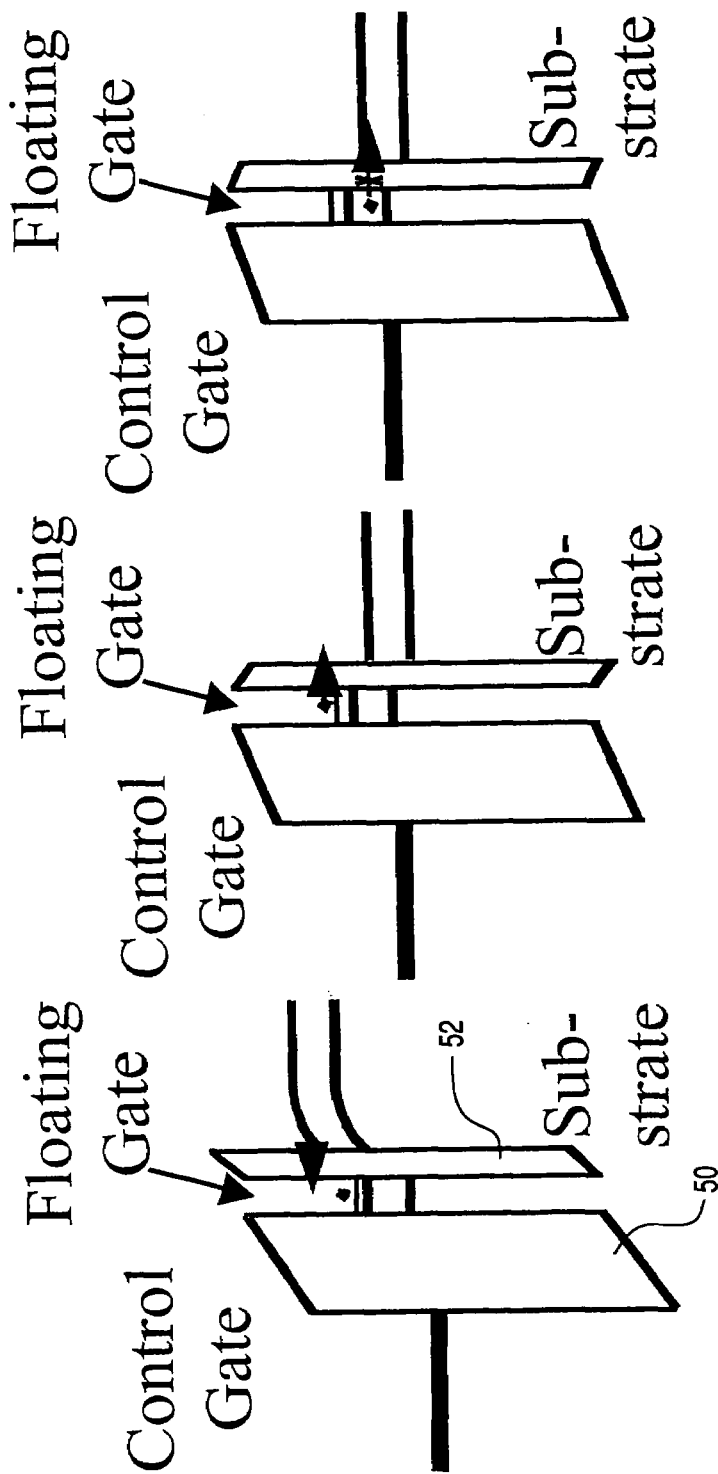
FIG. 2(a) (writing)  FIG. 2(b) (retention)  FIG. 2(c) (retention)

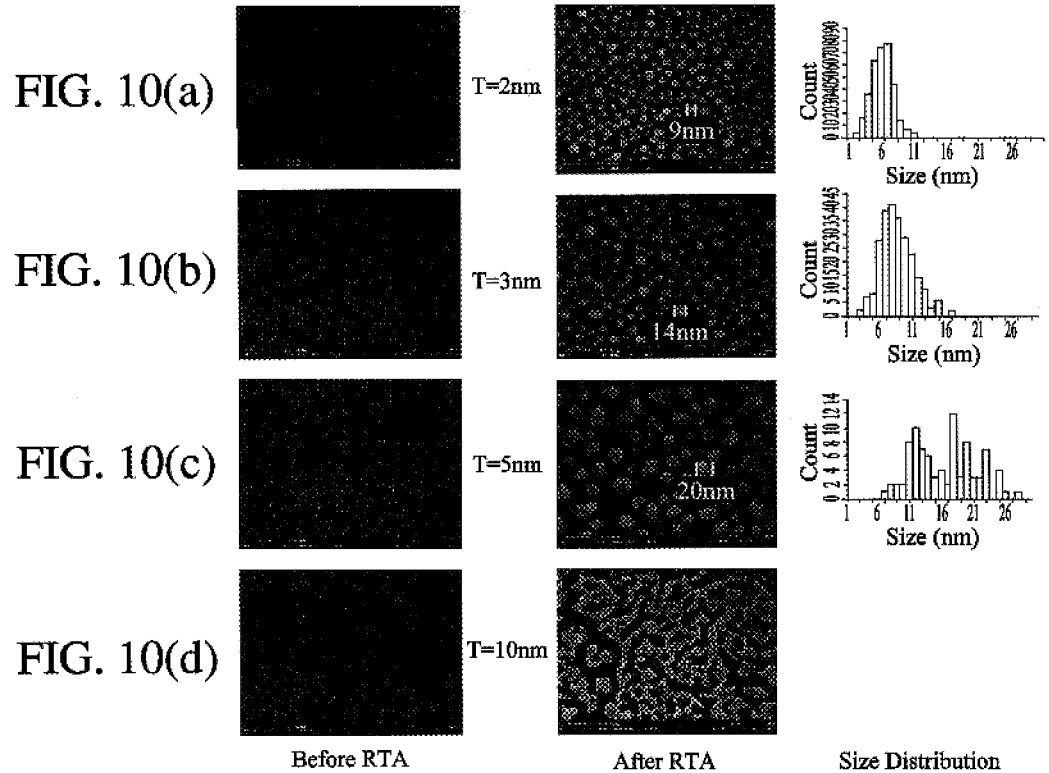

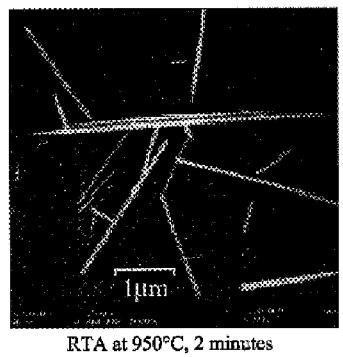
FIG. 11(a) RTA at 950°C, 2 minutes
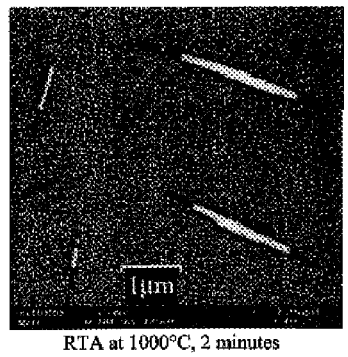
FIG. 11(b) RTA at 1000°C, 2 minutes
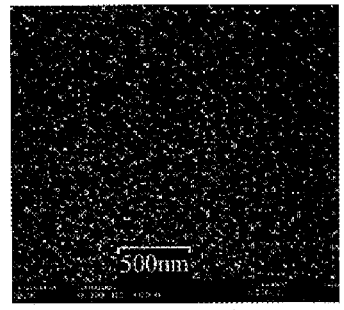
FIG. 11(c) RTA at 1050°C, 2 minutes
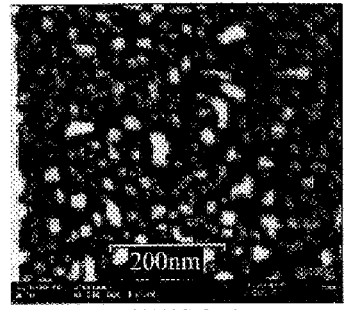
FIG. 11(d) RTA at 1100°C, 2 minutes Definition of active region 1 μm field oxidation Stripping nitride and pad oxide layers Gate stack formation Definition of gate pattern followed
by S/D ion implantation PECVD oxide deposition for isolation
between gate and S/D Etching contact window W sputtering and etching for final metalization Nanocrystal Memory Split-gate MOSFET "Good cell"

"Overprogrammed cell"

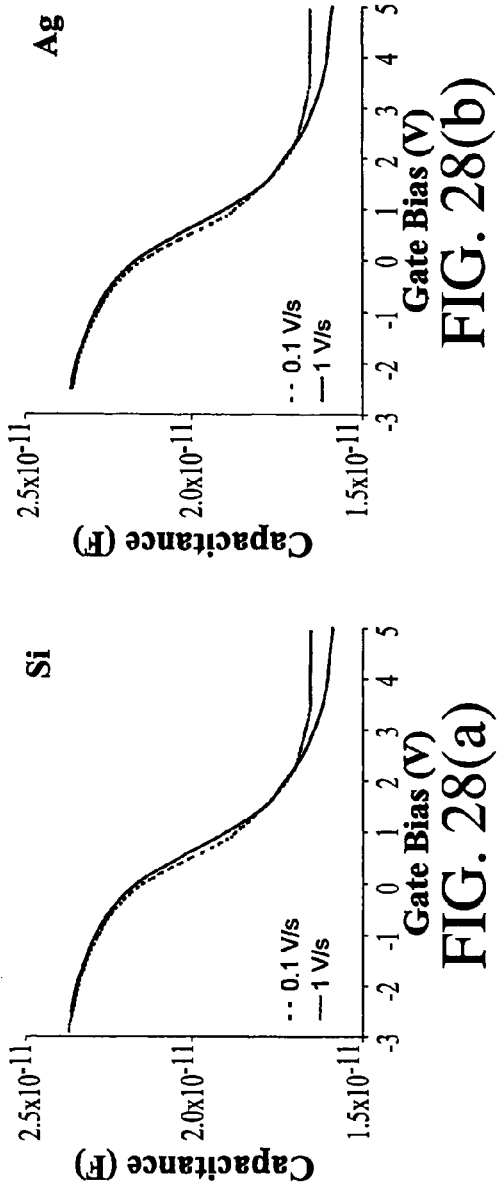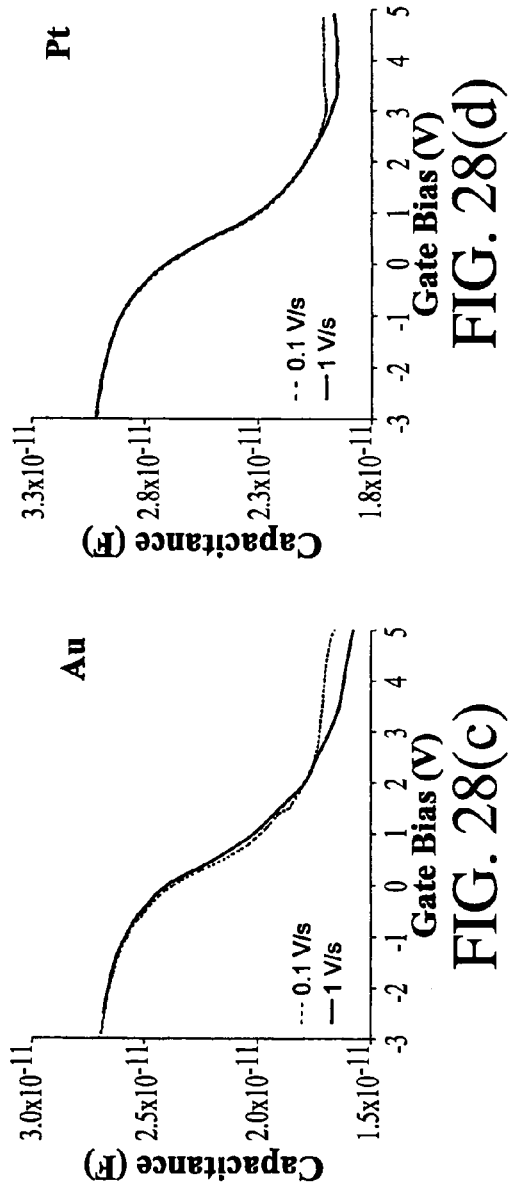

MULTIBIT METAL NANOCRYSTAL MEMORIES AND FABRICATION

CROSS-REFERENCE TO RELATED APPLICATIONS

This application claims the benefit of Provisional Application No. 60/428,906, filed Nov. 26, 2002, the disclosure of which is hereby incorporated herein by reference.

GOVERNMENT SPONSORSHIP STATEMENT

This invention was made with Government support from the National Science Foundation (NSF) under Grant No. 9,980,100. The Government has certain rights in the invention.

BACKGROUND OF THE INVENTION

The present invention relates, in general, to metal nanocrystals and methods of fabricating the same, and more particularly to semiconductor memory devices incorporating metal nanocrystals to provide a multibit-per-cell storage capability.

Conventional DRAM or Flash memories have been widely employed for many years in a variety of applications. DRAMs allow fast write/erase, but suffer from high power consumption incurred by the constant refresh operations due to their short retention time of less than a few seconds (see B. El-Kareh et al, "The Evolution of DRAM Cell Technology", Solid State Technology, Vol. 40, pp 89, May 1997). It is also very difficult to fabricate high-density DRAMs, because a large capacitor is necessary for every cell for charge retention and sufficient perturbation of the bit line to trigger sense amplification during reading. Flash memories, which offer longer than 10 years of retention time, have the drawbacks of high operation voltage and slow write/erase because of their relatively thick tunnel oxide. Known nanocrystal memories and MNOS (SONOS) memory devices employing discrete charge traps as storage elements have exhibited great potential in device performance, power consumption, and technology scalability, thus recently attracting much research attention as promising candidates to replace the conventional DRAM or Flash memories. However, such devices have not solved all of the problems inherent in such devices.

SUMMARY OF THE INVENTION

In accordance with the present invention, metal nanocrystal memories are utilized to further enhance the performance of memory cell devices through work-function engineering. The electrical characterization of metal nanocrystal memories, for both single and multi-bit operations, is described herein, as is a process for fabricating the memories, the parameters of the devices, the write/erase and retention characteristics of the metal nanocrystal memory devices, an operation scheme to achieve multi-bit-per-cell storage with nanocrystal memories, and elusion of metal contamination in these devices through IV and CV.

More particularly, in accordance with the present invention, a memory cell incorporates discrete charge storage elements, or metal nanocrystals, embedded in an oxide layer between a control gate electrode and the surface of a semiconductor substrate. Source and drain regions are located on the substrate on opposite sides of a channel region which is adjacent the metal nanocrystals. The oxide material between the gate and the metal nanocrystals is referred to as a control oxide, while the oxide material between the metal nanocrystals and the semiconductor surface is referred to as a tunnel oxide. When stored in these discrete states of electrons, charges are more immune to leakage, thus improving device charge retention.

The charge retention characteristics of the foregoing memory cell are improved, in accordance with the invention, by engineering the depth of the potential well at the charge storage element locations, or nodes, to create an asymmetrical barrier between the substrate and the storage nodes, to provide a small barrier for writing and a large barrier for retention. This is accomplished by fabricating the storage modes from metal nanocrystals so that the work function of the metal nanocrystals affects the charge transport through the gate oxide to simultaneously achieve fast write/erase times and long retention times. The writing can be further enhanced by making nanocrystal decorated control gate contacts, where the built-in field from metal-interface dipoles effectively lower the injection barrier from the control gate.

A significant feature of the herein-described memory cells is the capability of such cells to store multiple bits in a single device. Because nanocrystal memories exhibit minimal lateral coupling between the nanocrystals, multibit storage is achieved by selectively charging multiple discrete, small portions of the nanocrystals and translating the charging asymmetry into the device I-V characteristics. Thus, for example, nanocrystals adjacent the source and the drain electrodes in the memory cell are separately and asymmetrically charged by the source and drain bias voltages, and these separate charges are separately retained in the cell.

BRIEF DESCRIPTION OF THE DRAWINGS

The foregoing, and additional objects, features and advantages of the invention will become apparent to those of skill in the art from the following detailed description of preferred embodiments thereof, taken with the accompanying drawings, in which:

FIG. 1(a) is a schematic of a memory cell with discrete charge storage elements;

FIGS. 1(b)–1(d) are band diagrams illustrating different approaches for improving the $I_{G,Write/Erase}/I_{G,Retention}$ ratio of the memory cell of FIG. 1(a);

FIG. 2(a) is a band diagram for Si nanocrystal memories under writing;

FIGS. 2(b) and 2(c) are band diagrams for Si nanocrystal memories under retention for electrons stored in the nanocrystals (FIG. 2(b)), and for electrons which fall in traps below the conduction band edge (FIG. 2(a));

FIGS. 10(*a*)–(*d*) illustrate the effect of initial film thickness on Au nanocrystal formation;

FIG. 11 illustrates the effect of annealing temperature on W nanocrystal formation;

FIG. 21(*b*) illustrates a schematic cross-section of a split-gate MOSFET used to simulate the asymmetrical charging effect;

FIG. 21(*c*) illustrates a virtual ground array architecture used by the 2-bit nanocrystal memory cell of FIG. 21(*a*);

FIGS. 28(*a*)—(*d*) illustrates deep depletion HFCV measurements for minority carrier lifetime estimation for Si, Ag, Au, and Pt.

DETAILED DESCRIPTION OF PREFERRED EMBODIMENTS OF THE INVENTION

Figure 3:
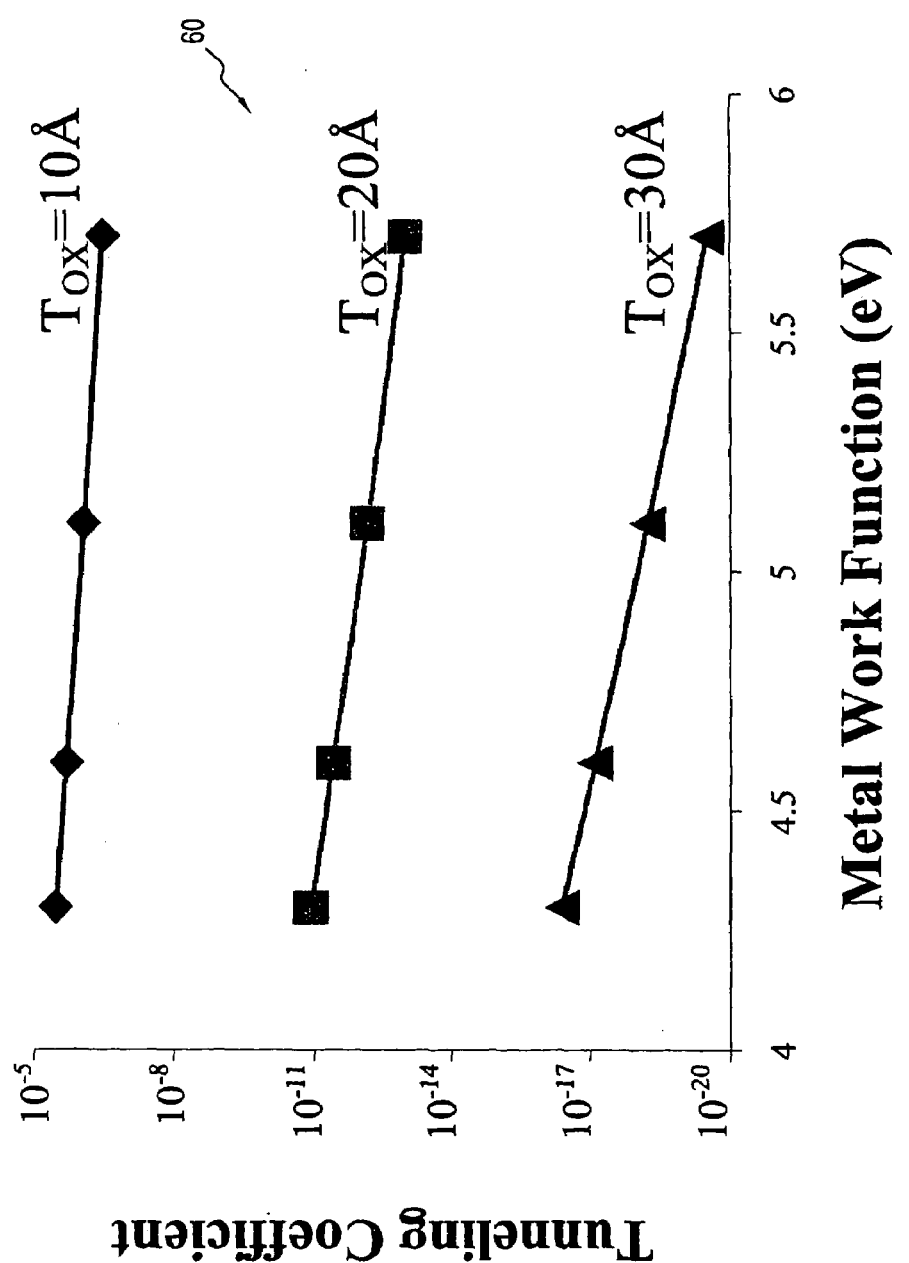
FIG. 3 illustrates tunneling transmission coefficients through a rectangular $SiO_2$ barrier from metals with different work functions.

Turning now to a more detailed description of the invention, FIG. 1(*a*) illustrates in diagrammatic form a schematic of a memory cell 10 having discrete charge storage elements or nodes 12, which function as charge traps, embedded in an oxide layer 14, or gate dielectric, between a control gate electrode 16 and the surface 18 of a semiconductor substrate 20. Source and drain regions 22 and 24, respectively, are located on the substrate on opposite sides of a channel region 26, which is adjacent the location of the charge storage elements 12. The oxide material between the gate 16 and the charge storage elements 12 is referred to herein as the control oxide 28, while the oxide material between the elements 12 and the surface 18 is referred to as the tunnel oxide 30.

As illustrated in FIG. 1(*a*), when stored in discrete traps or nodes, charges are more immune to the leakage caused by localized oxide defects, such as the defect illustrated at 31, thus improving the device retention characteristics. Memories with discrete charge storage elements such as the charge traps illustrated at 12 in FIG. 1(*a*) allow more aggressive scaling of the tunnel oxide and exhibit superior characteristics compared to Flash memories in terms of operation voltage, write/erase speed, and endurance. By using an ultra-thin tunnel oxide 30, dynamic or quasi-nonvolatile operations can also be achieved to compete with DRAMs. Moreover, the discreteness of the charge traps 12 enables multi-bit-per-cell storage as will be described in greater detail below, without going through the multi-level approach, which poses stringent requirements on the control of threshold spread. The discrete charge storage elements 12 utilized in such devices are usually traps in a nitride film, or isolated Si or Ge nanocrystals fabricated by various techniques, including chemical vapor deposition, low energy ion implantation, annealing of silicon rich oxide, thermal oxidation of SiGe, and aerosol nanocrystal formation.

To improve such devices, the goal is to combine the fast write/erase characteristics of DRAM devices with the long retention time of Flash memories. For this purpose an asymmetry in charge transport through the gate dielectric 14 is created in order to maximize the $I_{G,Write/Erase}/I_{G,Retention}$ ratio. Three different approaches for achieving this goal are illustrated in the band diagrams of FIGS. 1(*b*), 1(*c*) and 1(*d*). By replacing the usual rectangular barrier with a parabolic or triangular barrier 32, as illustrated in FIG. 1(*b*), the barrier height can be modulated by the electric field in the tunnel oxide. Therefore, a higher tunnel-barrier will be present during retention, produced by a low electric field, represented by the solid lines 34 in FIG. 1(*b*), while a lower barrier is present during write/erase operations produced by a high electric field induced by external bias, represented by dashed lines 36 in FIG. 1(*b*), thus increasing the $I_{G,Write/Erase}/I_{G,Retention}$ ratio. In practice, the parabolic or triangular barrier can be simulated by stacking multiple layers of dielectrics.

Another approach is to use double-stacked storage elements having a band diagram 40, illustrated in (FIG. 1(*c*), preferably self-aligned, with smaller storage elements in the lower stack. In such devices, fast write/erase can still be achieved, if sufficiently thin tunnel oxides are used below and between the two stacks, and the retention time is significantly improved due to the Coulomb blockade effect at the lower stack, which prevents electrons in the top stack storage elements from tunneling back into the substrate.

The third and preferred approach, illustrated by the band diagram 42 of FIG. 1(*d*), which is the focus of this invention, is to engineer the depth of the potential well at the storage elements, thus creating an asymmetrical barrier between the substrate and the storage elements, i.e. a small barrier for writing and a large barrier for retention. This is achieved, in the present invention, by using metal nanocrystals as the storage elements 12 with a silicon substrate. Then by carefully selecting the metal work function, the barrier height can be adjusted by about 2 eV, giving a great deal freedom for device optimization.

The major advantages of metal nanocrystals over their counterpart semiconductor nanocrystals and insulator traps include higher density of states around the Fermi level, stronger coupling with the conduction channel, a wide range of available work functions, and smaller energy perturbation due to carrier confinement. The higher density of states makes metal nanocrystals more immune to Fermi-level fluctuation caused by contamination, so the metal nanocrystals tend to have more uniform charging characteristics, resulting in tighter $V_{TH}$ control. The wide range of available work functions with metal nanocrystals provides one more degree of design freedom to select the trade-off between write/erase and charge retention, because the work function of nanocrystals affects both the depth of the potential well at the storage element, or node, and the density of states available for tunneling in the silicon substrate. By aligning the nanocrystal Fermi level to be within the Si bandgap under charge retention conditions and above the conduction band edge under charge erase conditions, a large $I_{G,Erase}/I_{G,Retention}$ can be achieved even for very thin tunnel oxides. Because writing is performed by tunneling electrons from the Si substrate into the nanocrystals, and can always find available states to tunnel into, and can have a current level similar to $I_{G,Erase}$, fast write/erase and long retention times can be achieved simultaneously in metal nanocrystal memories.

Metal nanocrystals also provide a great degree of scalability for the nanocrystal size. In semiconductor nanocrystals, the band-gap of the nanocrystals is widened in comparison with that of the bulk materials due to multidimensional carrier confinement, and this reduces the effective depth of the potential well and compromises the retention time. This effect is much smaller in a metal nanocrystal because there are thousands of conduction-band electrons in a nanocrystal even in a charge neutral state. As a result, the increase of Fermi level is minimal for metal nanocrystals of nanometer size. Experimental work on the treatment of ITO (Indium-Tin Oxide) by thin Pt films has indicated that the work function of metal thin-films does not deviate dramatically from their bulk value down to about 0.4 nm in thickness. To provide single-electron or few-electron memories utilizing the Coulomb blockade effect, smaller nanocrystals are preferred. Accordingly, the Coulomb blockade effect can be better exploited with metal nanocrystals to achieve ultra low-power memories without compromising the retention time from quantum mechanical confinement effects.

Nanocrystal memories use the same device structure as shown in FIG. 1(*a*), and the write/erase operations are usually performed by tunneling electrons or holes between the nanocrystals 12 and the conduction channel through the tunnel oxide 30. A new degree of freedom in designing such devices is introduced by the use of metal nanocrystals, for work function selection may be used to tune the work function of the metal nanocrystals to affect the charge transport through the gate oxide in order to achieve fast write/erase and long retention times, simultaneously.

Depending on the thickness of oxide 14, the charge transport is dominated by either direct tunneling or F-N tunneling. In the direct-tunneling regime, a thin oxide tunnel layer 30, which may be $SiO_2$ with a thickness of less than 3 nm, is used to separate the nanocrystals 12 from the channel 26 in the semiconductor substrate 20. During write/erase operations, electrons/holes can pass through the oxide 30 by direct tunneling, which gives the advantages of fast write/erase and low operation voltage, as illustrated in the band gap diagram of FIG. 2(*a*). However, the retention time suffers if the storage elements 12 are silicon nanocrystals used as floating gates, as illustrated in FIG. 2(*b*).

As illustrated in FIG. 2(*a*), due to the quantum confinement effect, the bandgap 50 of silicon nanocrystals is wider than the band gap 52 of the silicon substrate. For a typical silicon nanocrystal size of 5 nm, the ground state is ~0.1 eV above the conduction band edge. Together with the electric field generated by the extra electrons stored in the nanocrystals, this effect makes it very easy for the electrons to tunnel back into the substrate after writing (FIG. 2(*b*)) and results in rather short retention time. Actually, traps inside the nanocrystals or at the nanocrystal/$SiO_2$ interface (FIG. 2(*c*)) have to be assumed to explain the relatively long retention time observed in experiments, which complicates the controllability and characteristic uniformity of silicon nanocrystal memories.

This shortcoming can be overcome by replacing silicon nanocrystals with metal nanocrystals. In this case, traps at the nanocrystal/$SiO_2$ interface play almost no role, due to the high density of states of the metal, which gives more uniform device characteristics and easier process control. Moreover, the leakage current from the metal nanocrystals can be tuned by adjusting their work functions. There are two effects which can be utilized to benefit the retention time.

First, by using metal nanocrystals with a larger work function, the barrier height seen by the electrons inside the nanocrystals is increased. The increase of barrier height translates into reduced tunneling probabilities and enhanced charge retention. FIG. 3 illustrates at graph 60 the tunneling coefficient vs. metal work function for electrons tunneling through a rectangular oxide barrier, for metals with three different work functions, calculated by 1D WKB approximation. The Figure illustrates that even though direct tunneling is more sensitive to barrier width than to barrier height, 2 to 4 orders of magnitude reduction in leakage current can still be achieved if large work function metals, such as Au or Pt, are used in place of silicon for the nanocrystals.

For the tunneling, or transmission, coefficients to translate into real tunneling current, states must be available on the other side of the barrier into which the electrons can tunnel. If elastic tunneling is assumed, which is a reasonable assumption due to the thin oxide thickness involved, tunneling is prohibited for electrons having energies within the bandgap of the silicon substrate. Those electrons have to be thermally excited into states above the silicon conduction band edge in order to tunnel through. This thermal process will reduce the tunneling current even further.

Figure 4:
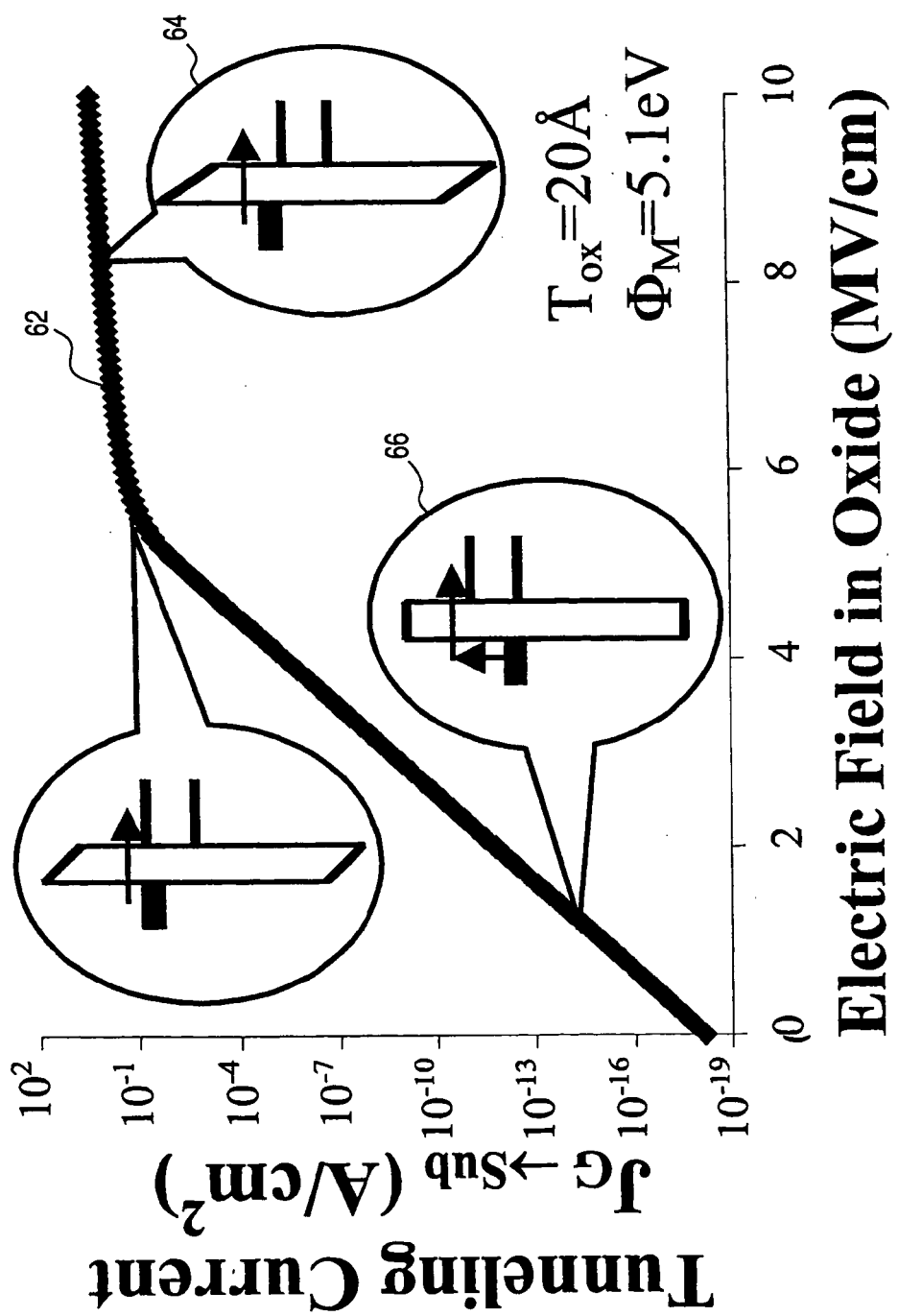
FIG. 4 illustrates electron direct tunneling current from Au nanocrystals to Si substrate as a function of the electric field in tunnel oxide.

FIG. 4 illustrates at 62 a simulated electron tunneling current from metal to a Si substrate as a function of the electric field in an oxide layer. The metal used in the simulation is Au and the oxide thickness is set to be 2 nm. FIG. 4 illustrates that in the high-field region 64 where the Fermi level of nanocrystals is above the substrate conduction band edge, the tunneling current is large and only changes moderately with bias; in the low field region 66, however, the offset of nanocrystal Fermi level in the substrate conduction band edge introduces a strong reduction in the tunneling current, and an $I_{on}/I_{off}$ ratio of larger than $10^{15}$ can be achieved. If hole tunneling is included, the $I_{on}/I_{off}$ ratio will be reduced due to the increase of $I_{off}$. In practice, careful selection of substrate doping has to be made to minimize hole tunneling.

Figure 5:
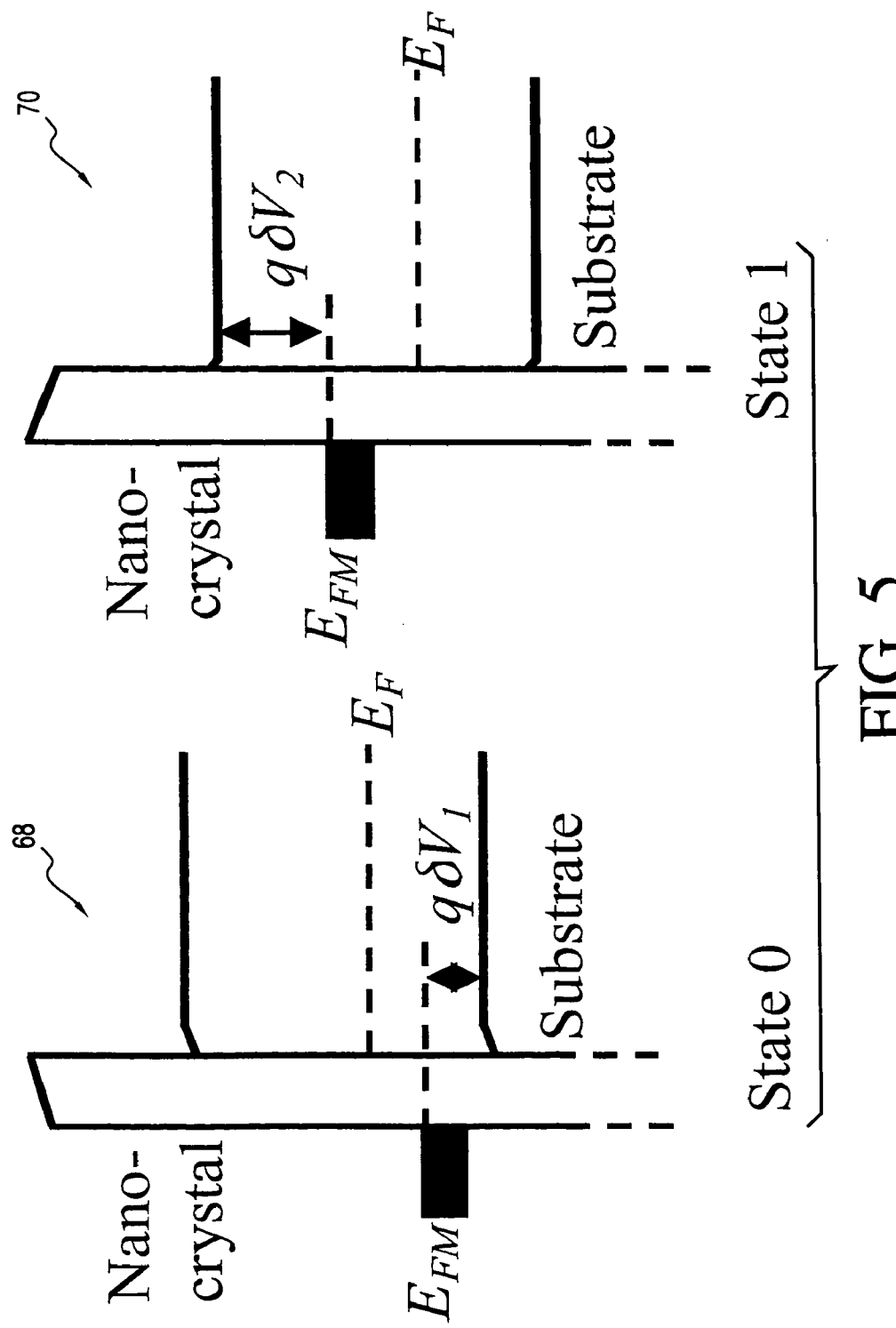
FIG. 5 illustrates band diagrams illustrating the design considerations with work function engineering.

FIG. 5 illustrates the design considerations in exploiting this work-function effect. There are four tunneling processes contributing to leakage current in a device: at state 0, illustrated by band diagram 68, electrons can tunnel from the substrate to the nanocrystals and holes can tunnel from the nanocrystals to the substrate; at state 1, illustrated by band diagram 70, holes can tunnel from the substrate to the nanocrystals and electrons can tunnel from the nanocrystals to the substrate. To minimize both the electron and hole tunneling from the substrate to the nanocrystals, $E_F$ needs to be set carefully by substrate doping. Afterwards, trade-off between retention time and readability has to be made in setting the device operation points.

It can be seen from FIG. 5 that maximizing $\delta V_1$ and $\delta V_2$ will improve the retention time, at the price of reduced readability. For effective read-out, $\delta V_{TH}$ of about 1 V is necessary to separate the two states. For a typical device with 2 nm thick tunnel oxide 30 and 8 nm thick control oxide 28, that translates into about a 0.2 eV difference at the nanocrystals in the band diagram, and hence sets $\delta V_1$ and $\delta V_2$ to be about 0.5V. This margin can be significantly enhanced if the silicon substrate 20 is replaced with a wide-band-gap semiconductor. However, the suppression of leakage current is effective only if a clean interface can be achieved between the substrate and the gate insulator; otherwise, tunneling through the interface states will take place and increase the leakage current.

Because of the discreteness of the nanocrystals 12, the control-gate coupling ratio of nanocrystal memory devices is inherently small. As a result, F-N tunneling cannot serve as an efficient write/erase mechanism when a relatively thick tunnel oxide is used, because the strong electric field cannot be confined in one oxide layer. However, this situation can be changed by the work function selection available with metal nanocrystal memories. By manipulating the work function of both the nanocrystals and the control gate, one can change the corresponding barrier height, thus changing the turn-on electric field for F-N tunneling from the nanocrystals and control gate. Then, even with similar electric fields in the control and tunnel oxides, F-N tunneling can be confined into one oxide layer, thus improving the write/erase efficiency.

Figure 6:
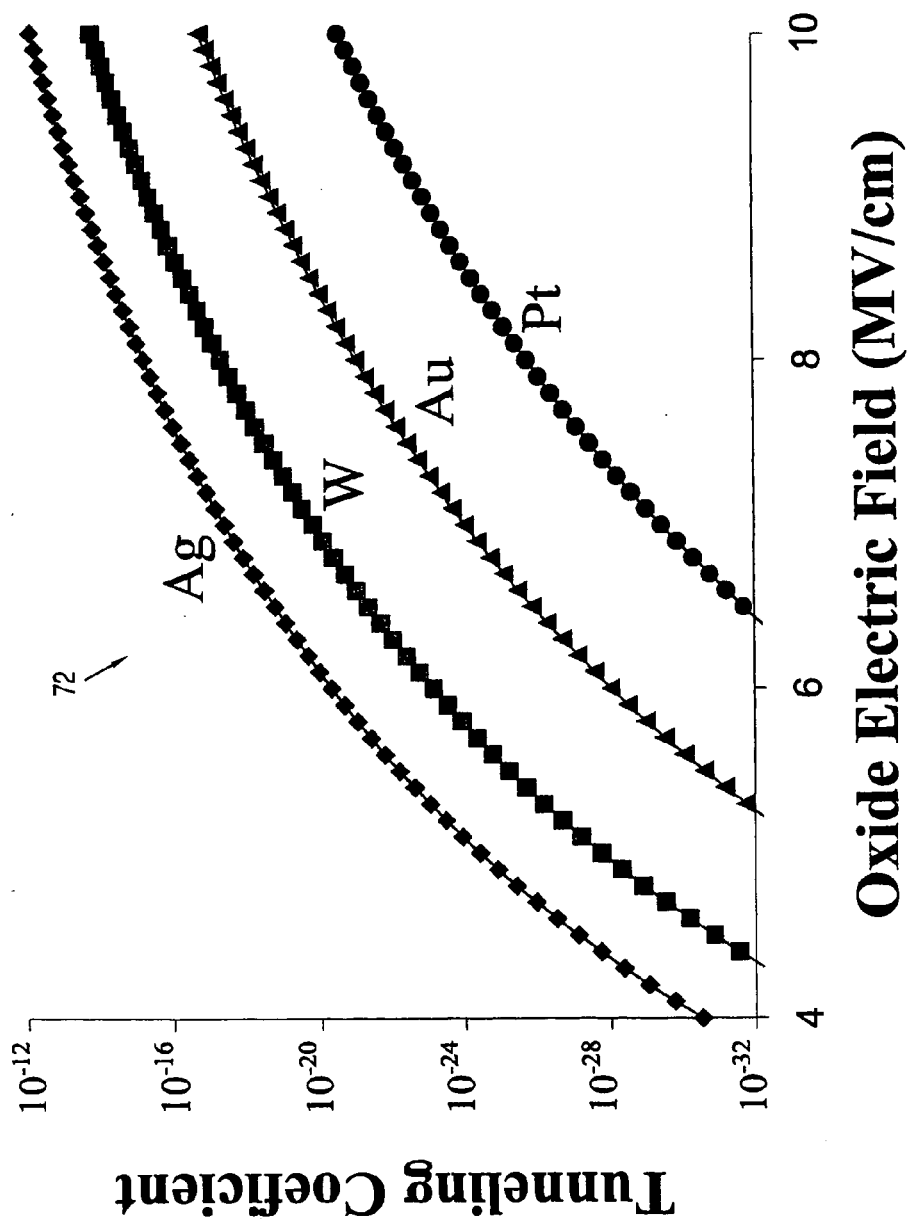
FIG. 6 illustrates F-N tunneling transmission coefficients through $SiO_2$ barrier from metals with different work functions.

FIG. 6 illustrates at 72 the work function dependence of F-N tunneling on the turn-on electric field for various metals, showing that F-N tunneling probability has a very strong dependence on the metal work function. The reason is that, in the F-N-tunneling regime, both the height and the width of the barrier are modulated by the work function. By increasing the work function by 0.3 eV, the tunneling, or transmission, coefficient can be suppressed by 2 to 4 orders of magnitude, depending on the electric field selected for write/erase. However, manipulating only the work function of the nanocrystals is not sufficient to confine tunneling into one oxide layer and to have effective write/erase. As shown at 74 in FIG. 7, it is assumed that the erase operation is performed with a positive $V_{CG}$ and reaches steady state, at the end of erase:

$$I_{E1}(E_{E1}, X_{Si}) = I_{E2}(E_{E2}, \Phi_{FG}) \quad \text{(Eq.2)}$$

with the charge density in the nanocrystals given by:

$$\rho = (E_{E2} - E_{E1}) \quad \text{(Eq.3)}$$

Figure 7:
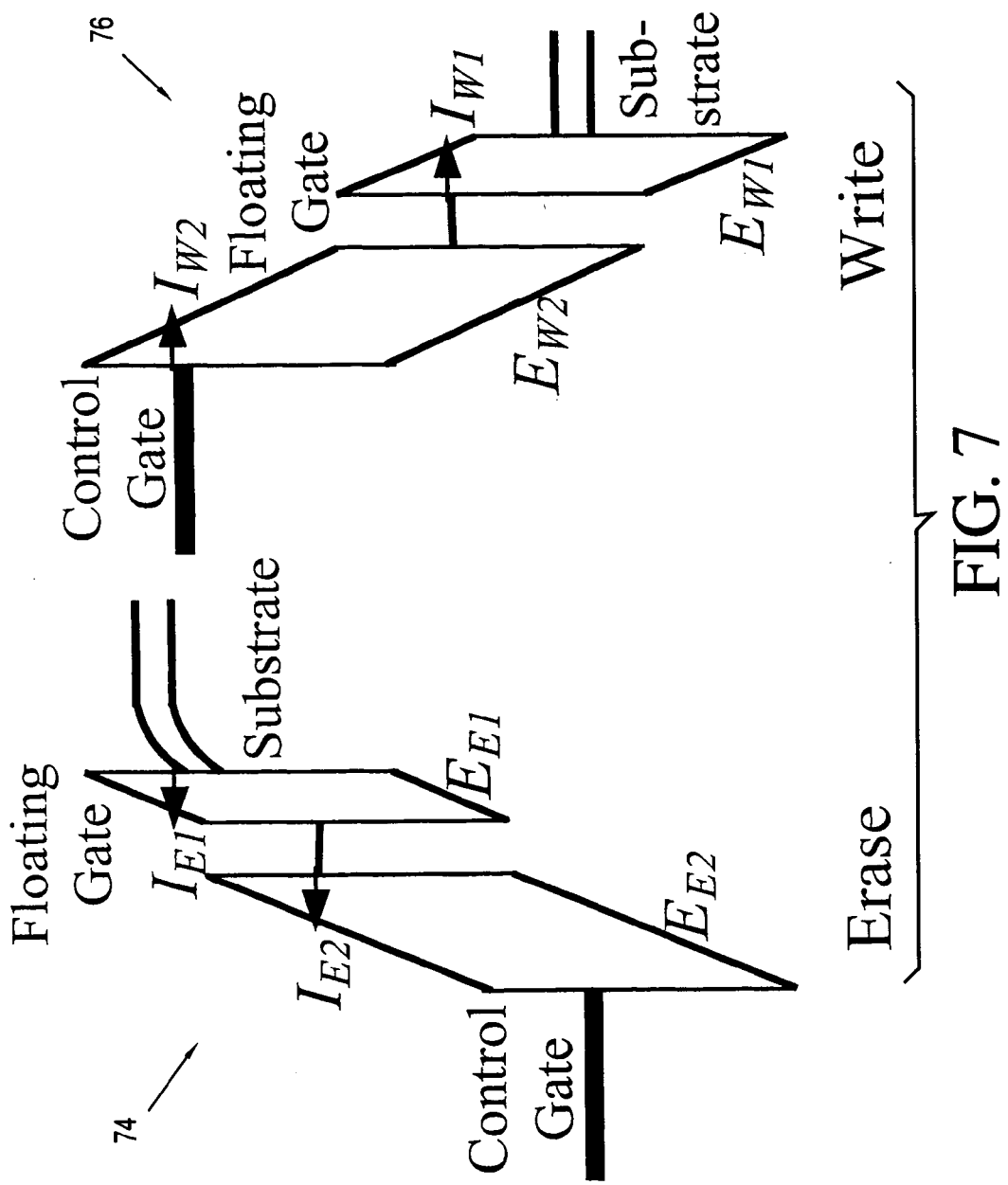
FIG. 7 is a band diagram illustrating the necessity of tuning control gate work function in order to achieve effective write/erase operations in the F-N tunneling regime.

When a negative $V_{CG}$ is applied for the write operation, illustrated at 76 in FIG. 7, it is first assumed that the device is biased in such a condition that $$E_{W1} = E_{E2} \quad \text{(Eq.4)}$$

At the beginning of writing, because the nanocrystals are still holding the same amount of charge as after erase, it is easy to show that $$E_{W2} = E_{E1} \quad \text{(Eq.5)}$$

Then, if the control gate is made of poly-silicon, neglecting the difference in electron distribution:

$$I_{W2}(E_{W2}, X_{Si}) \cdot I_{W1}(E_{W1}, \Phi_{FG}) = I_{E2}(E_{E2}, \Phi FG) = I_{E1}(E_{E1}, X_{Si}) \quad \text{(Eq.6)}$$

and the device cannot be effectively written independently of the selection of the nanocrystal work function. The above equations also hold true if the control gate is made of metals with the same work function as the electron affinity of the Si substrate.

To avoid this problem, the work function of the control gate ($\Phi_{CG}$) has to be tuned to suppress or enhance tunneling from the control gate. If $\Phi_{CG} > X_{Si}$, tunneling will be limited within the tunnel oxide and writing can be performed by extracting electrons from the nanocrystals. If $\Phi_{CG} < X_{Si}$, a smaller control gate bias can be used for the write operation to initiate tunneling only in the control oxide and extra electrons can be injected into the nanocrystals. After choosing the control gate work function, the threshold voltage can be tuned by the nanocrystal work function, because it determines the charge density of nanocrystals under steady states.

It can be seen from the analyses above that the concept of work function engineering can also be applied to conventional Flash memories. However, the thermal and mechanical incompatibility of metal film on top of an ultra thin gate oxide makes the process difficult, due to concerns about oxide integrity, interface states and channel carrier mobility. In nanocrystal memories, on the other hand, those problems can be alleviated through self-assembled nanocrystal formation, which produces thermodynamically stable structures and introduces minimal contaminations into the oxide and channel region underneath. A repeatable self-assembly process has been developed and demonstrated, using Au, W, Ag and Pt nanocrystal formation on thin oxide film. The effect of various process parameters on nanocrystal formation has been analyzed, including material, initial metal film thickness, thermal annealing profile, etc., and this process has been incorporated into a simplified NMOS process to fabricate metal nanocrystal memory devices.

Figure 8:
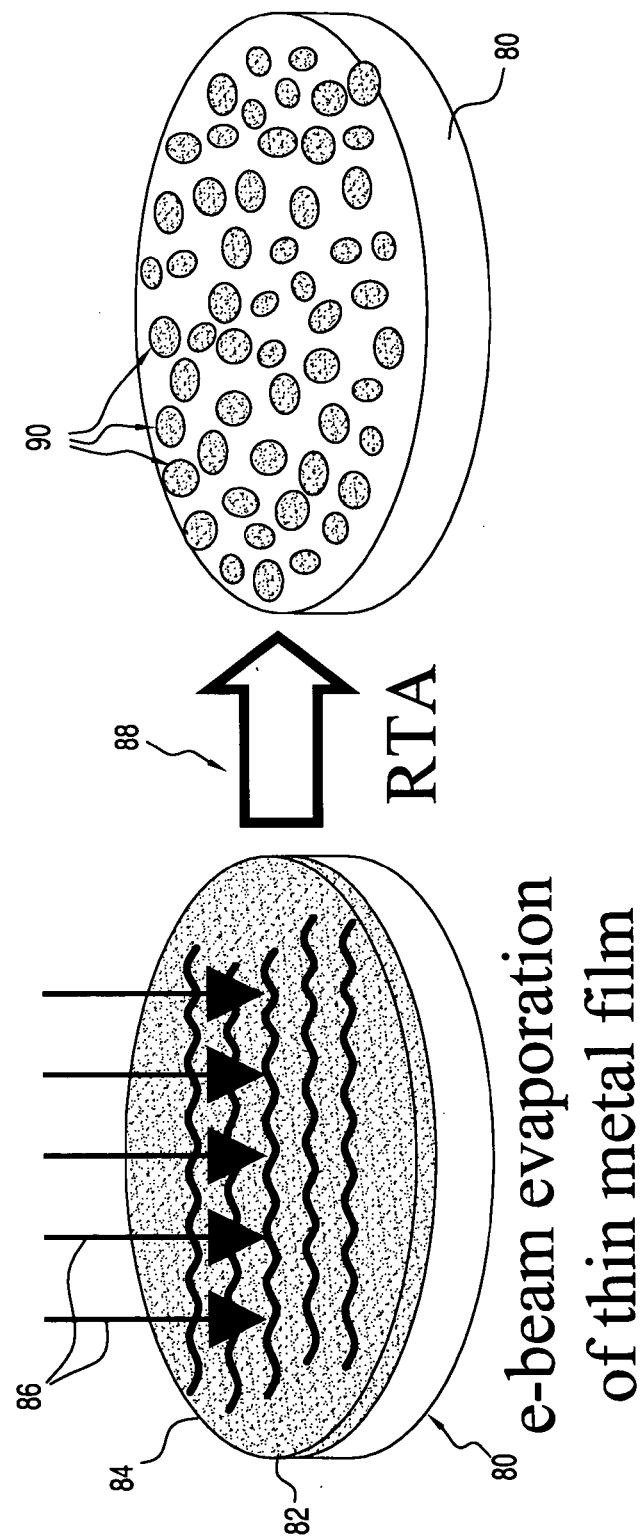
FIG. 8 illustrates a process sequence for metal nanocrystal formation.

The basic procedures for metal nanocrystal formation are illustrated in FIG. 8. Starting with a Si wafer 80 covered by a thin layer of thermal oxide 82, a metal wetting layer 84 of 1 to 5 nm thickness is deposited by e-beam evaporation, illustrated by arrows 86. Then, the film is annealed at elevated temperatures (RTA) close to its eutectic temperature with the substrate in an inert ambient, illustrated at 48, to transform the wetting layer into nanocrystals 90. This process is achieved through relaxation of film stress and is limited by surface mobility. Some long-range forces such as the dispersion force and the electrical double layers will also affect the nanocrystal size and location distributions.

Figure 9:
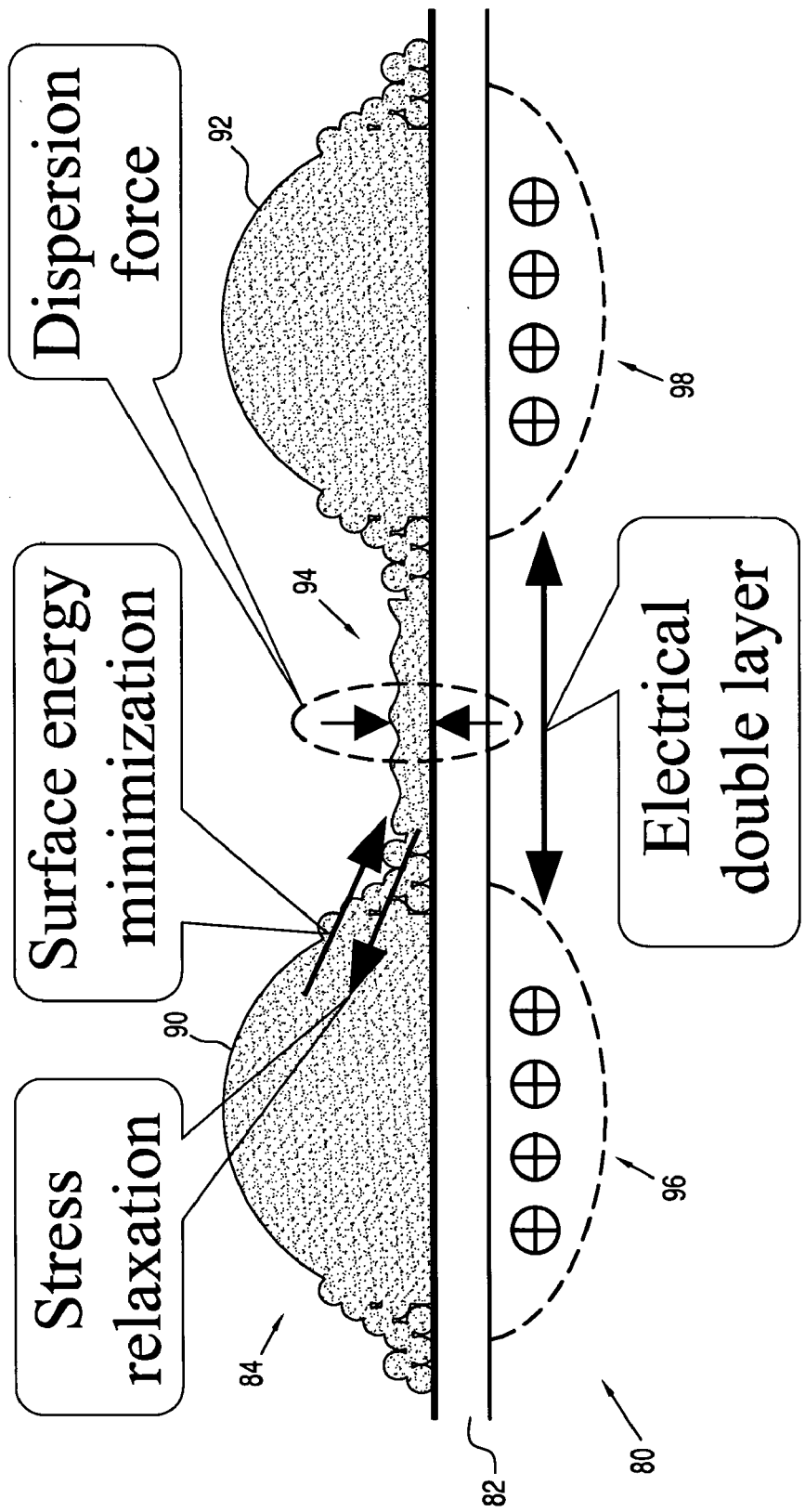
FIG. 9 is a schematic illustration of the driving forces in the self-assembly process of FIG. 8.
Figure 12A:
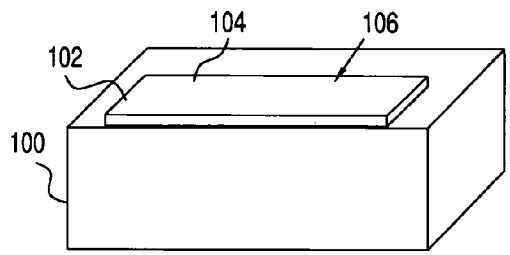
FIGS. 12(*a*) to 12(*h*) illustrate a process flow for fabricating metal nanocrystal memory devices.
Figure 12B:
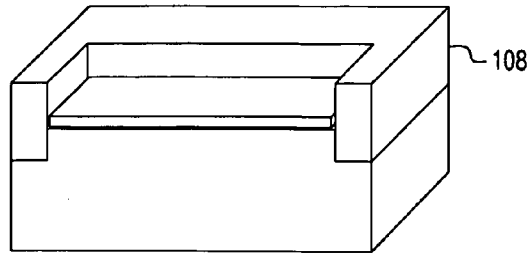
Figure 12C:
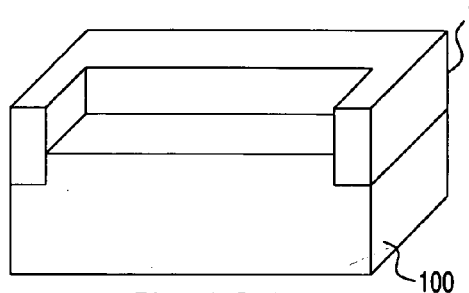
Figure 12D:
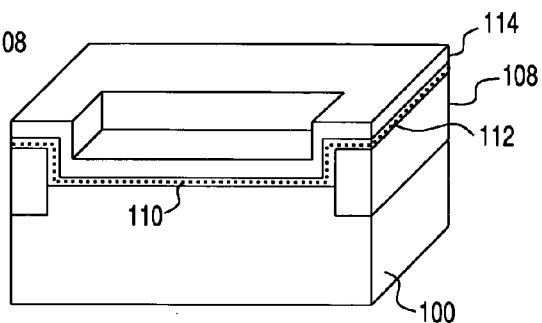
Figure 12E:
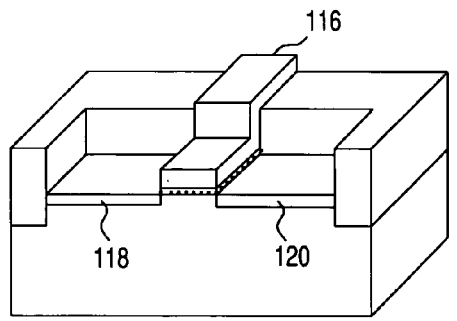
Figure 12F:
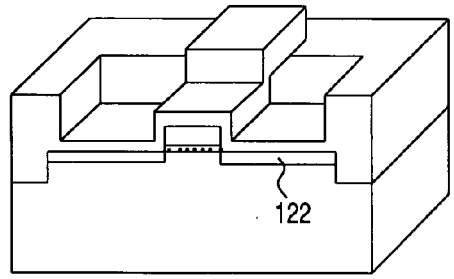
Figure 12G:
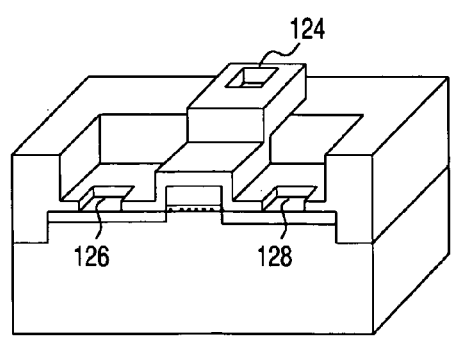
Figure 12H:
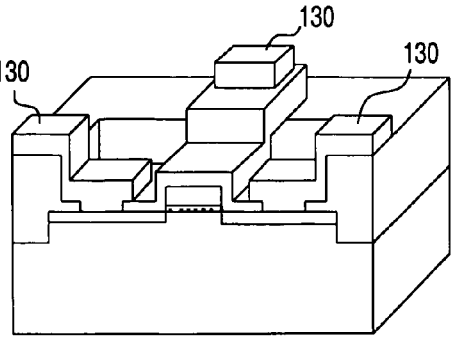

Before RTA, the as-deposited film 84 naturally has some thickness perturbation, and nanocrystals may start to form, although without a clear separation. When the film 84 is RTA treated to give the atoms enough surface mobility, however, the film will self-assemble into a lower total-energy state. FIG. 9 illustrates the major driving forces that contribute to this process. To reduce the elastic energy carried by the stress built into it during the deposition process, the film 84 tends to break into islands 90, 92 along an initial perturbation 94. Minimization of the surface energy and the dispersion force between the top and bottom interfaces can help stabilize the film, so the final geometry will depend on the balance between these driving forces. Once the nanocrystals 90, 92 have formed, the work function difference between the metal and the extrinsic substrate 80 generates localized depletion or accumulation regions 96, 98 in the substrate. The repulsion force between those regions helps to stabilize the nanocrystals and to keep a uniform distance between them.

FIGS. 10(*a*)–(*d*) show SEM pictures of nanocrystal formation before and after RTA from Au films 84 of different thicknesses of 2 nm, 3 nm, 5 nm and 10 nm, respectively, on top of an 8 nm thick thermal oxide layer 82, and the resulting nanocrystal size distribution. All samples went through the same annealing cycle at 550° C. for 5 minutes. For thin film under 3 nm in thickness, nanocrystals can be seen even without annealing. After RTA, well-defined nanocrystals with round shapes and certain size distribution can be achieved. As the film grows thicker, the deposited film shows more inter-links between nanocrystals and gradually transforms into irregular interlocked islands, so that after RTA, the nanocrystals become bigger with wider and more irregular size distribution. When the film exceeds a certain thickness threshold, interlocked islands remain after RTA and no nanocrystals are formed (FIG. 10(*d*).

The effect of the annealing profile in W nanocrystal formation is shown by SEM pictures in FIGS. 11(*a*)–(*d*). At low temperatures, the nucleation sites are sparse and the atoms have limited surface mobility. As the result of different growth rate along different crystal orientations, needles having aspect ratios as large as 40:1 can be formed after RTA. When the annealing temperature is raised, both the number of nucleation sites and the atom surface mobility increase. Then the RTA tends to generate needles with smaller aspect ratios until at 1050° C. (FIG. 11(*c*)), when nanocrystals instead of needles are formed.

Nanocrystal formation for other materials that cover a wide range of work functions, including Ag, Co and Pt, has been demonstrated, and similar behavior has been observed. With films ranging 1 to 5 nm in thickness, a working RTA window for nanocrystal formation can be found in most cases. Table I summarizes the typical RTA conditions used for different materials.

distribution, metal nanocrystals can be incorporated into a standard MOSFET structure to fabricate non-volatile memory devices. The key steps of a simplified NMOS process are illustrated in FIGS. 12(*a*)–12(*h*).

Starting with a p-type silicon wafer 100 (FIG. 12(*a*)), a 20 nm thick thermal oxide layer 102 is grown by dry oxidation, followed by a 100 nm thick nitride deposition 104 as the oxidation mask for LOCOS isolation. The active region 106 is defined by optical lithography and reactive ion etching (RIE) of the nitride layer. Then 1 μm field oxide 108 is grown by wet oxidation (FIG. 12(*b*)). A maskless RIE is performed to strip the nitride on top of the active region (FIG. 12 (*c*)). Channel implantation followed by annealing is then applied for threshold voltage adjustment and control of punch through.

For the gate stack formation (FIG. 12(*d*)), the wafer is first MOS cleaned with an HF dip to remove the pad oxide over the active region. Then the tunnel oxide 110 is grown by dry oxidation. Thereafter, the nanocrystal formation procedure is carried out, illustrated by dotted line 112, followed by PECVD oxide deposition to form the control oxide 114. The control gate 116 is formed on top of it by co-sputtering of Si and W (FIG. 12(*e*)), and the gate is patterned and etched by RIE. Then n+ ion implantation followed by RTA at 800° C. is performed to form a self-aligned source region 118 and a drain region 120. Another 0.5 μm oxide layer 122 is deposited (FIG. 12(*f*)) to provide spacer isolation between the gate and the source/drain. Contact windows 124, 126 and 128 to both the gate and source/drain are then opened (FIG. 12(*g*)) with one step lithography and etching. Finally, W is sputtered and patterned at 130 for the interconnect (FIG. 12(*h*)).

The above-described process integration may, in some cases, result in leftover nanocrystals in the source/drain area after gate etching; furthermore, care must be taken to preserve the thermal stability of the nanocrystals during the source/drain dopant activation, which usually requires an annealing temperature of 800° C. or higher. However, the metal nanocrystal memory devices fabricated with 800° C. dopant activation annealing demonstrated localized nanocrystal charging, and neither abnormal source/drain behavior (excessive resistance/leakage) nor trace of metal contamination in the substrate was observed.

Figure 13:
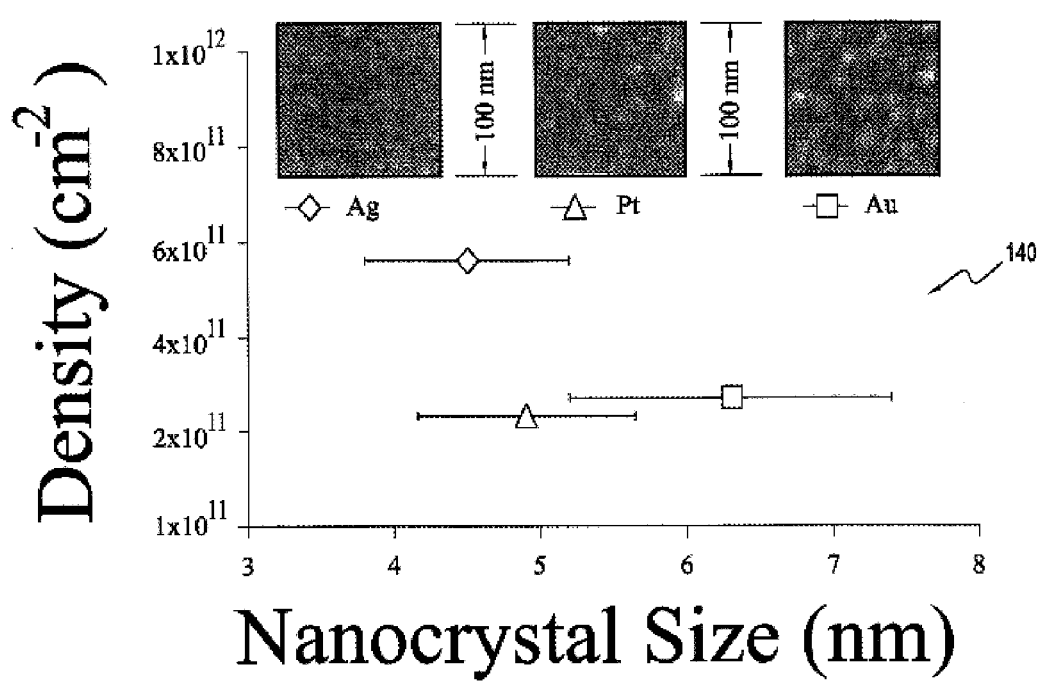
FIG. 13 illustrates the density and size distribution of Ag, Au and Pt nanocrystals.

N-channel metal nanocrystal memory devices using the technology described above, including MOSFETs with length and width ranging from 2 μm to 27 μm along with diodes and MOS capacitors of various sizes, were fabricated to demonstrate work-function engineering. FIG. 13 shows at 140 the density and size distribution of Ag, Au and Pt nanocrystals, with their respective SEM images shown in the inserts. Si nanocrystal memories and MOSFETs without nanocrystals were also fabricated as control devices. Table II summarizes the major process parameters of the test devices.

TABLE I

Typical RTA profiles for metal nanocrystal formation

| Materials | Peak Temperature | Annealing Time | Temperature Ramp Rate |
|---|---|---|---|
| Au | 550~600° C. | ~30 seconds | ~50° C./s |
| Ag | 550~550° C. | ~30 seconds | ~50° C./s |
| Pt | 900~950° C. | ~30 seconds | ~50° C./s |
| W | >1100° C. | ~30 seconds | ~50° C./s |
| Co | 600~700° C. | ~30 seconds | ~50° C./s |

Using the foregoing repeatable process for self-assembled nanocrystal formation with controllable density and size

TABLE II

Process parameters for fabricated nanocrystal devices

| Process Parameters | Value |
|---|---|
| MOSFET Length (μm) | 2–18 |
| MOSFET Width (μm) | 3–27 |
| Tunnel Oxide Thickness (nm) | ~8 |
| Control Oxide Thickness (nm) | ~30 |
| Nanocrystals | Si, Au, Ag and Pt |
| Control Gate | $WSi_2$ |
| Field Oxide Thickness (μm) | ~1 |
| Substrate Doping ($cm^{-3}$) | Boron, $10^{17}$ |
| Source/Drain Doping ($cm^{-3}$) | As or P, $10^{20}$ |

Due to the conservatively selected tunnel oxide thickness of 8 nm, all of the fabricated devices described above operated in the F-N tunneling regime. FIGS. 14(a)–(d) illustrate the write/erase characteristics of different devices with nanocrystals of Si, Ag, Au, and Pt, respectively, by F-N tunneling. The write/erase operation is performed by biasing the control gate 16 at +/−20V, respectively, while keeping the source 22 and drain 24 grounded. The gate currents under erase and write conditions for each material is shown in FIGS. 15(a) and 15(b), respectively.

Figure 14A:
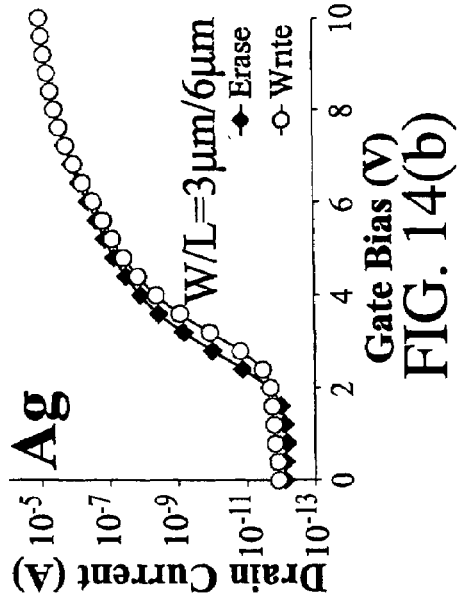
FIGS. 14(*a*)–(*d*) illustrate the write/erase characteristics of nanocrystal memory devices by F-N tunneling.
Figure 14B:
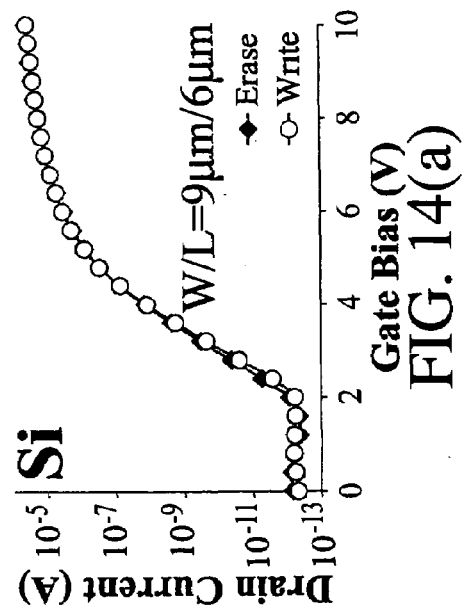
Figure 14C:
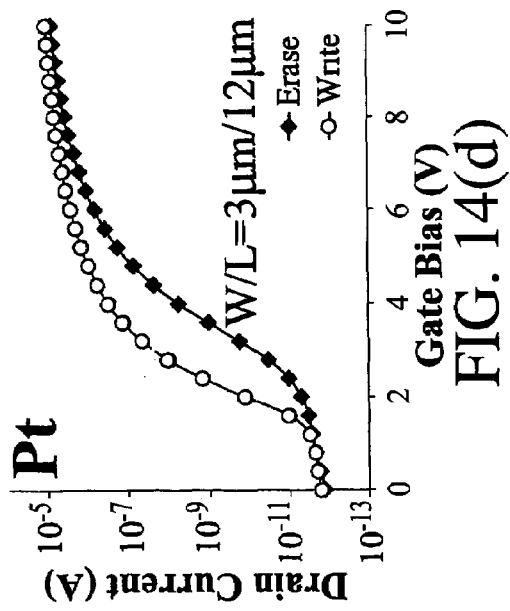
Figure 14D:
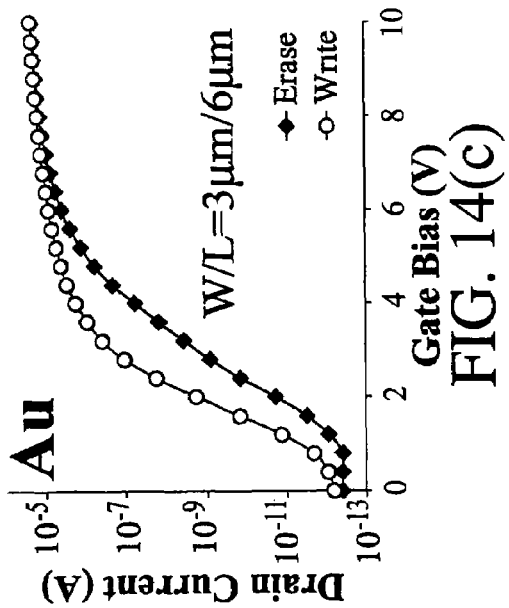
Figure 15:
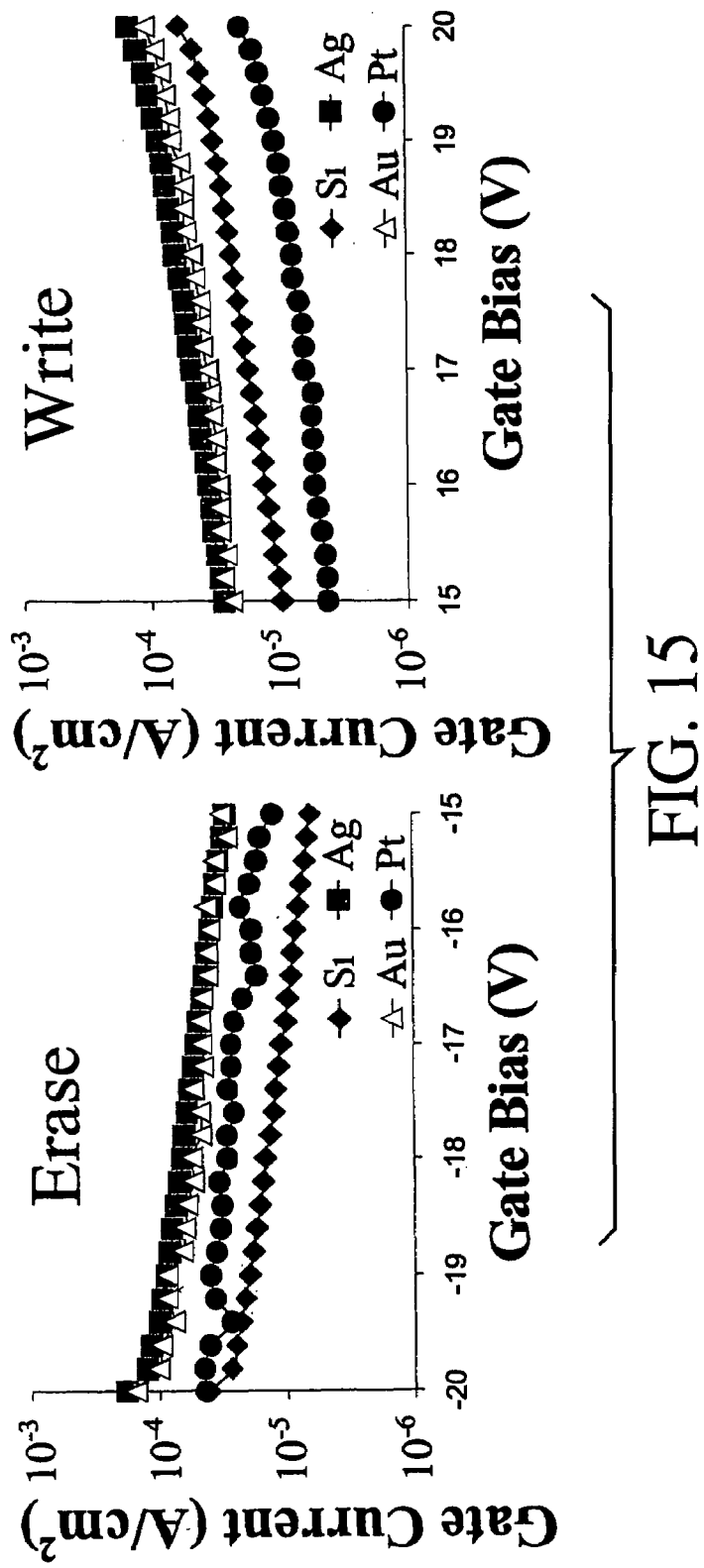
FIG. 15 illustrate the gate current under erase and write conditions, respectively, for the samples shown in FIG. 13.
Figure 16A:
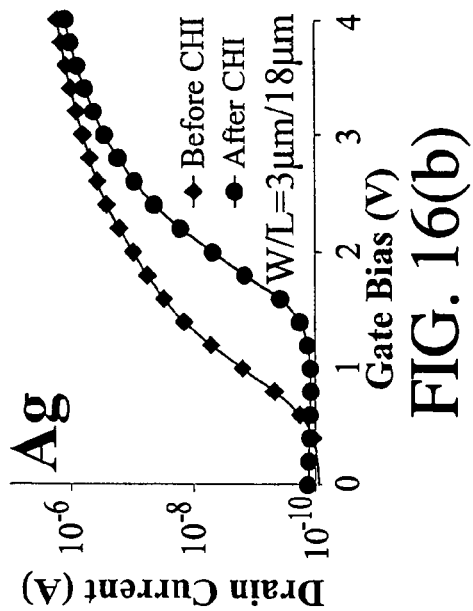
FIG. 16 illustrates a write operation by CHI for devices with different nanocrystals.
Figure 16B:
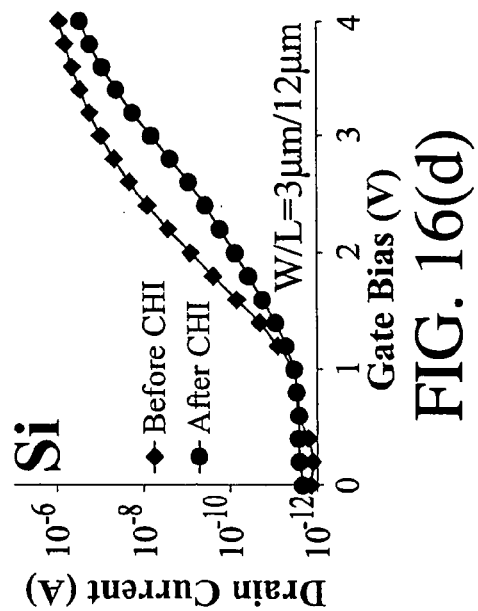
Figure 16C:
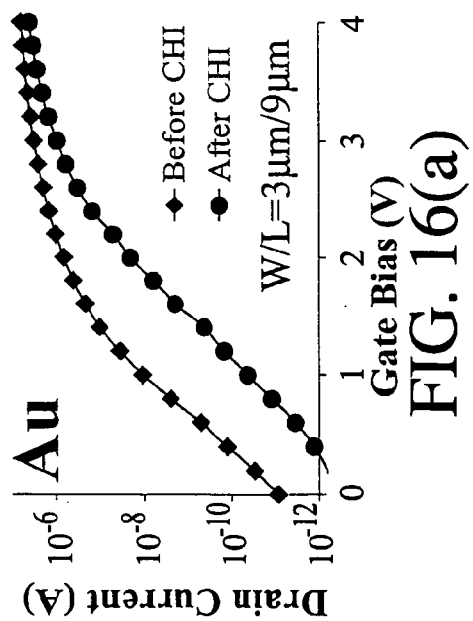
Figure 16D:
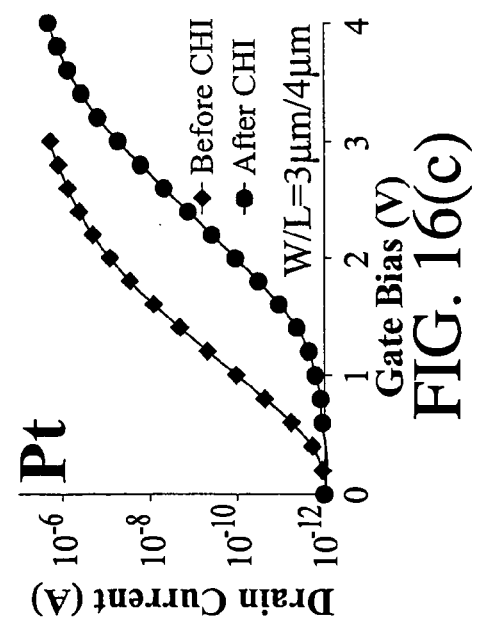

Although $WSi_2$ is used as the gate material in the foregoing device, a gradual transition from Si to W is used in device fabrication to ensure proper gate adhesion. A Si layer of a few nanometers in thickness exists at the control-gate/control-oxide interface, which makes the tunneling barrier height at the control gate and at the substrate essentially the same. This lack of asymmetry hinders the effectiveness of F-N tunneling as a write/erase mechanism, despite the nanocrystal work function. This is evident for the Si and Ag cases, as shown in FIGS. 14(a) and (b). The memory effect of the Au and Pt cases (FIGS. 14(c) and (d)) can be attributed to the trap enhanced leakage current in the control oxide 14, which can be seen from the noisier gate current under write/erase, as shown in FIG. 15. FIG. 14 also illustrates some slight degradation of subthreshold swing after erase, which is caused by the non-uniform charging of nanocrystals due to the random distribution of oxide traps.

Figure 17:
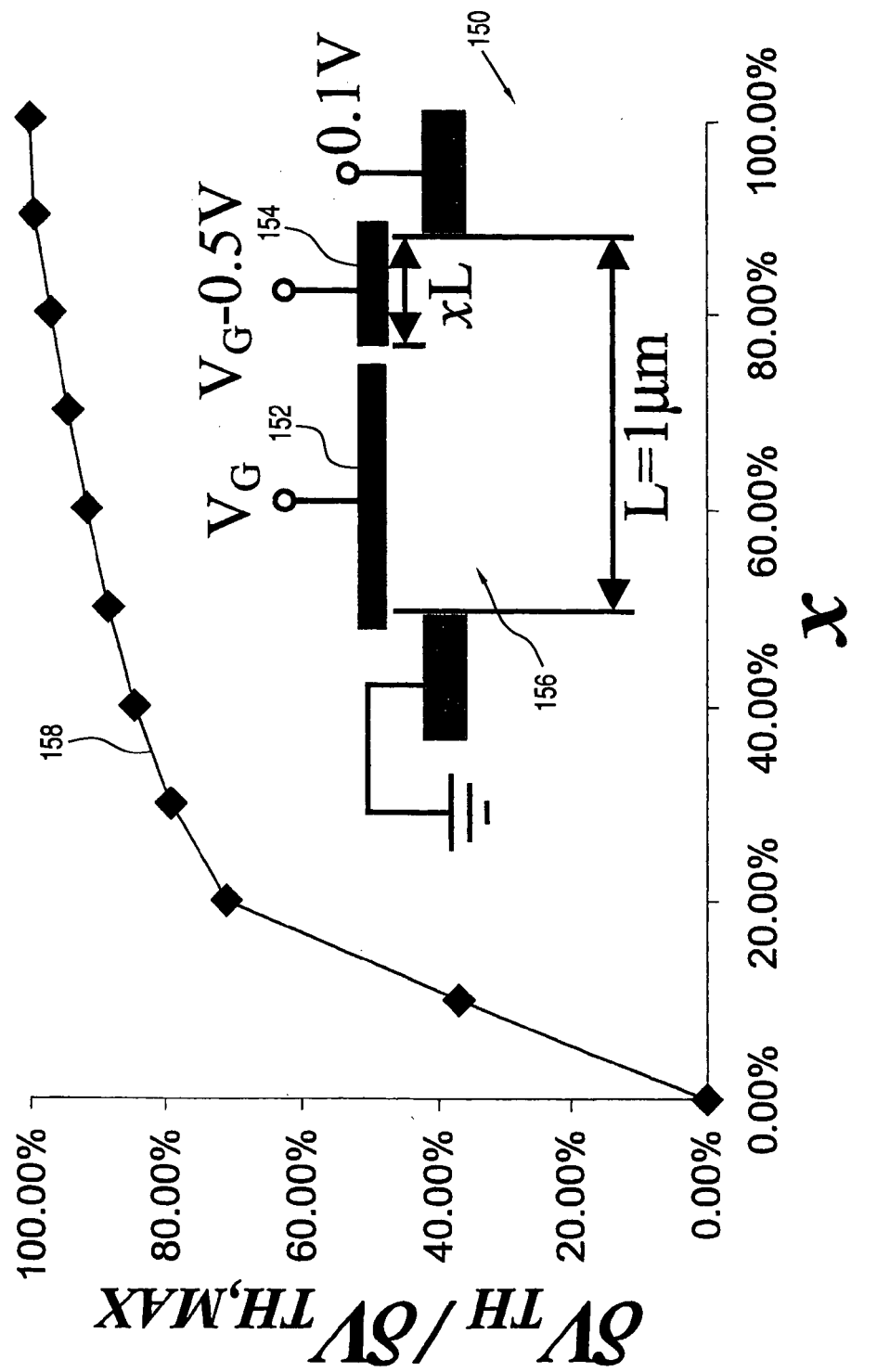
FIG. 17 illustrates the threshold voltage shift caused by local charging in a split-gate MOSFET.
Figure 18:
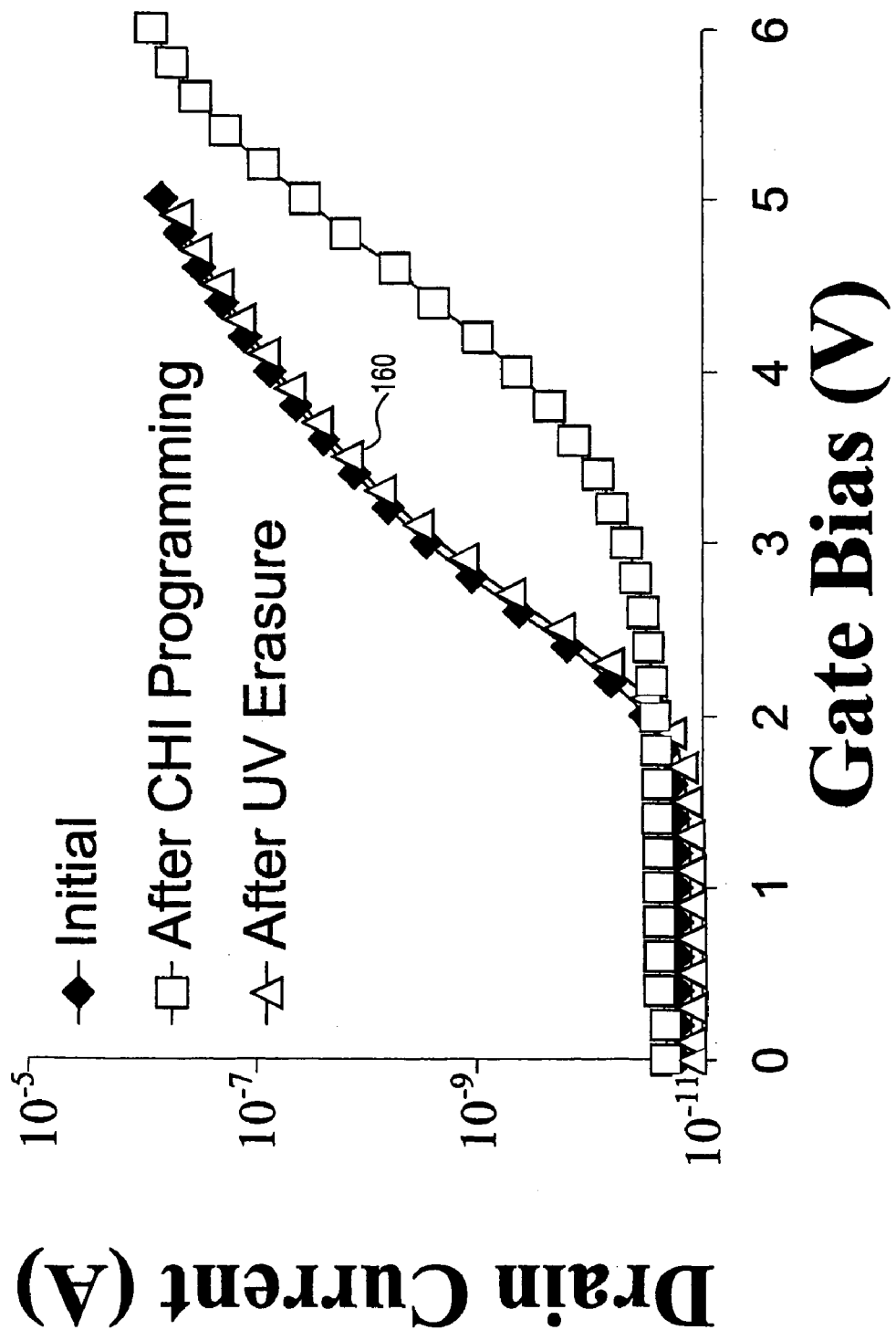
FIG. 18 illustrates the UV erase characteristic of a Ag nanocrystal memory device, with a device size of W/L=3 μm/9 μm.

Without effective F-N tunneling, the write operation can be achieved through channel hot-carrier injection (CHI). FIGS. 16(a)–16(d) illustrate the write operation by CHI for different devices, using Au, Ag, Pt and Si, respectively. Though CHI only happens at the drain end where a strong lateral electric field exists, and cannot charge all the nanocrystals, it is enough to create memory operations at low $V_{DS}$. FIG. 17 shows a 2D simulation of a split gate transistor 150, having gates 152 and 154 over channel 156. The curve 158 illustrates the local charging effect generated by CHI using the device simulator ATLAS. It can be seen that for the channel length L considered in the simulation, as long as the charged nanocrystals cover about 20 percent of the channel, effective threshold voltage shifts can be obtained. For devices written by CHI, erasure can be achieved either by UV exposure, as shown by curve 160 in FIG. 18, or by F-N tunneling.

Figure 19:
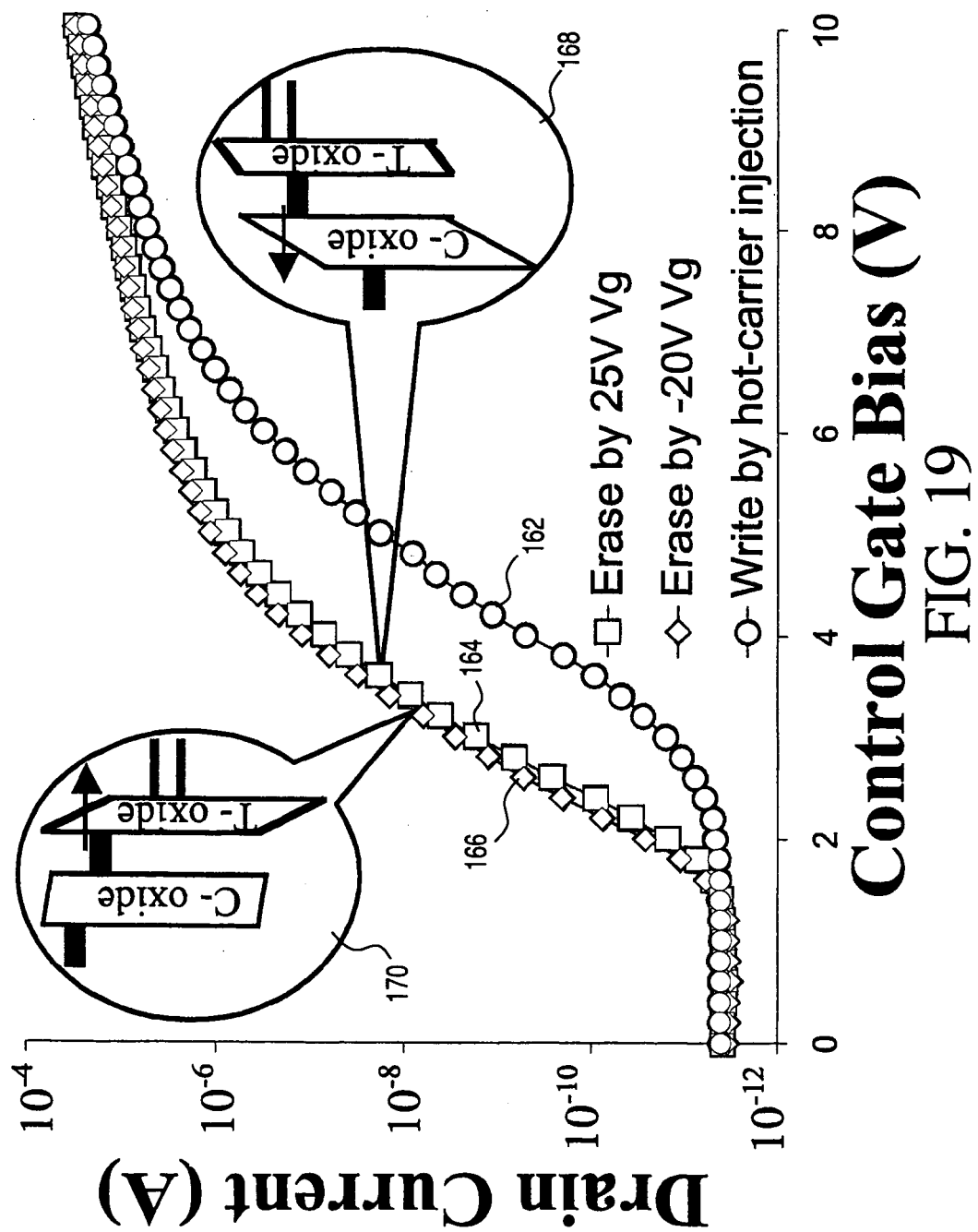
FIG. 19 illustrates the electrical erase characteristic of a Ag nanocrystal memory device, with a device size of W/L=3 μm/2 μm.

FIG. 19 shows, at curves 162, 164 and 166, respectively, the CHI write characteristics and the electrical erase characteristics of an Ag nanocrystal memory device. Devices with Ag nanocrystals are chosen for the erase test because of their better control-oxide quality, as demonstrated in the F-N tunneling test from FIGS. 14 and 15. An interesting feature of this device is that the electrical erase can be achieved through either positive (curve 164) or negative (curve 166) gate bias, with corresponding band diagrams being shown in the inserts 168 and 170, respectively, of FIG. 19. After CHI, the extra electrons injected into the nanocrystals close to the drain create asymmetrical electric fields in the control and tunnel oxides (C-oxide and T-oxide, respectively, in FIG. 19). As a result, for the charged nanocrystals, F-N tunneling turns on first in the tunnel oxide under negative gate bias, and in the control oxide under positive gate bias, and the net effect in both cases is to erase the cell. Due to the similar barrier heights at the control gate and the substrate, both operations return to the same state.

Figure 20:
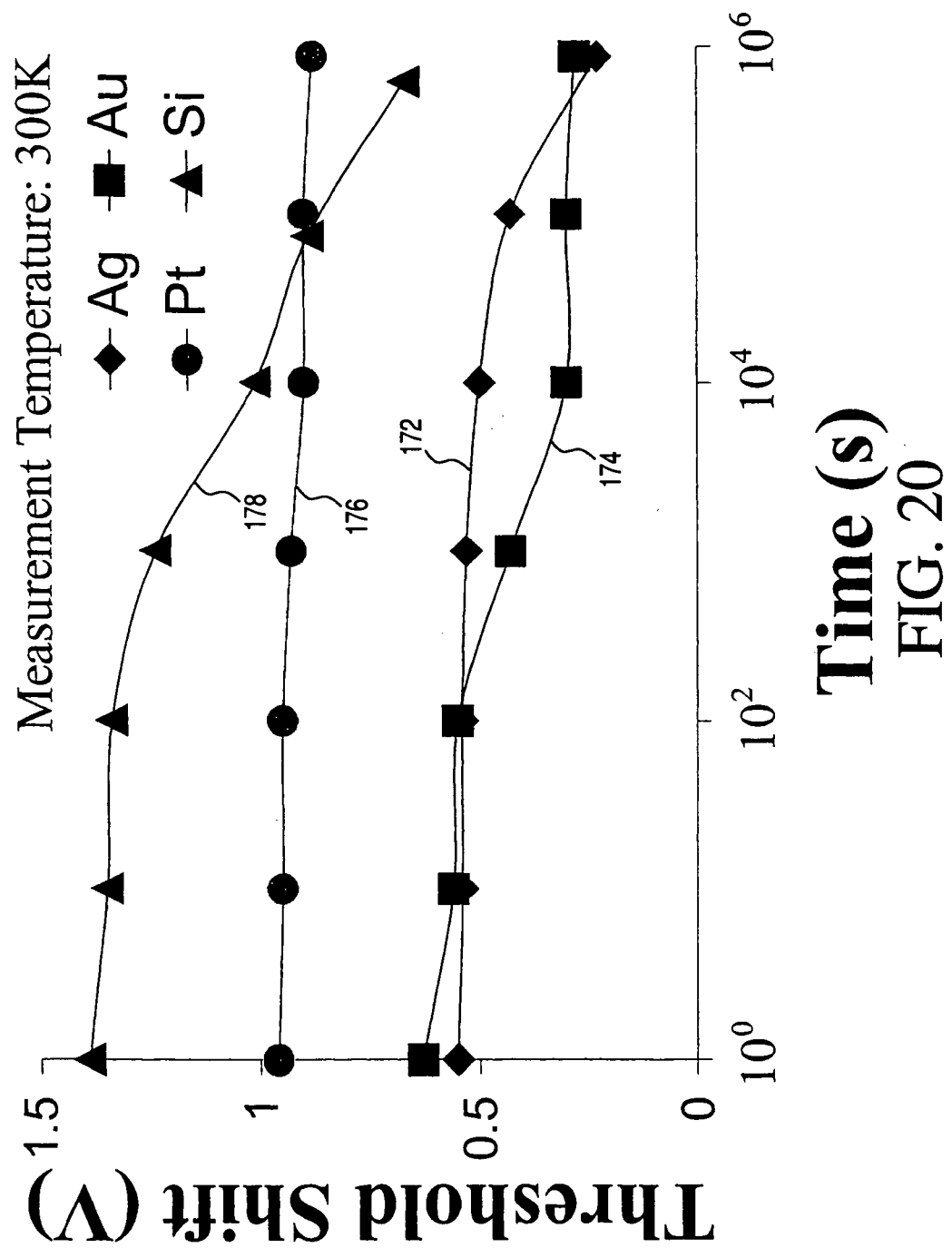
FIG. 20 illustrates the retention characteristics of the nanocrystal memory devices of the present invention.

FIG. 20 shows, at curves 172, 174, 176 and 178, typical pre-stressed retention characteristics of devices with different nanocrystals, including Ag, Au, Pt and Si, respectively. Retention time up to $10^6$ sec. (>1 week) is achieved for all the devices. Because the programming is performed by charging a small portion of the nanocrystals through CHI, the charge loss mechanisms during retention include both the vertical loss through the oxide and the lateral charge redistribution among the nanocrystals. Hence, the retention characteristic is not only determined by the vertical oxide thickness and barrier height, but also is influenced by the average distance between nanocrystals, which affects the lateral charge redistribution. From FIG. 13 it is seen that Pt nanocrystals have the largest distance between adjacent nanocrystals. Therefore, combined with their large work function, the device with Pt nanocrystals demonstrates the best retention characteristic, which is evident in FIG. 20.

A significant feature provided by nanocrystal memories in accordance with the present invention is the storage of multiple bits in a single device. In conventional Flash memories, multi-bit storage can only be achieved through a multi-level approach, which has stringent requirements on the control of the threshold spread. In nanocrystal memories, on the other hand, because of the minimal lateral coupling between the nanocrystals, multi-bit storage is achieved through a multi-element approach by selectively charging a small portion of the nanocrystals to produce a charging asymmetry and translating that asymmetry into the device I-V characteristics. The multi-element approach has the advantage of a relaxed requirement on threshold spread, for minimizing the lateral charge redistribution can be accomplished in nanocrystal memories through the control of the nanocrystal size and spacing.

Figure 21A:
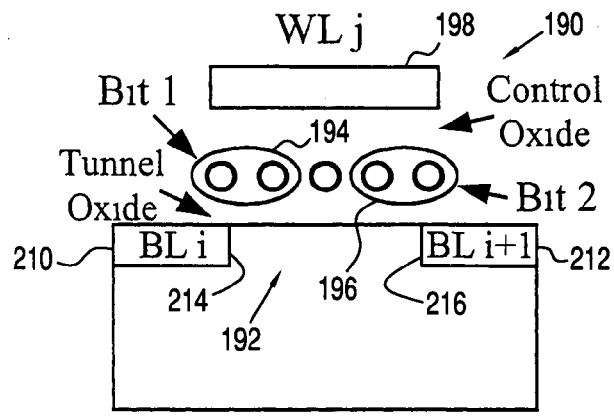
FIG. 21 (*a*) illustrates a schematic cross section of a 2-bit nanocrystal memory cell.
Figure 21B:
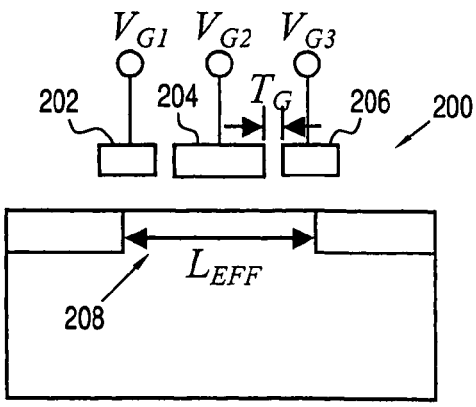
Figure 21C:
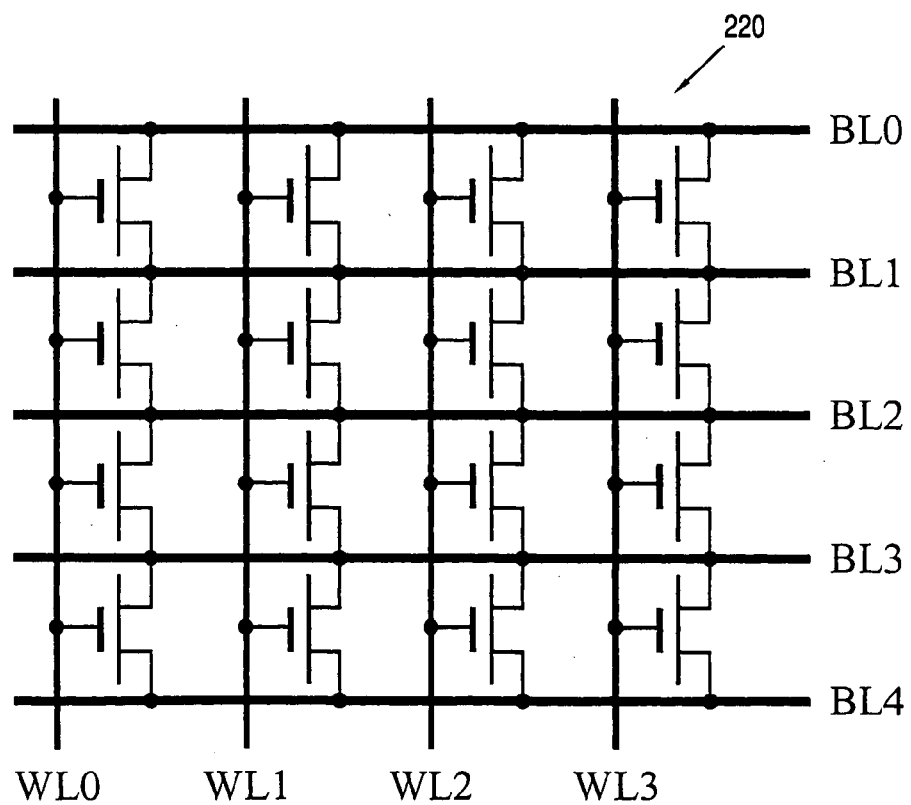

FIG. 21 (a) illustrates in diagrammatic form the cross section of a nanocrystal memory device 190 along a channel 192, and illustrates the location of two storage nodes 194 and 196 below a gate 198. Illustrated in FIG. 21(b) is a split-gate MOSFET 200 having gates 202, 204 and 206 located above a channel 208 and used to study the local charging effect by simulation. The storage nodes, or elements 122 and 124, for Bit 1 and Bit 2 are the portions of the nanocrystals which are located directly above side junctions 214 and 216 of source 210 and drain 212, respectively. FIG. 21(c) illustrates at 220 a virtual ground array architecture that can be used by the 2-bit nanocrystal memories. Using buried n+ implants as bit-lines and poly stripes as word lines, the array can be made contactless, thus resulting in a very compact cell. Combined with the good scalability of the nanocrystal memory devices and their multi-bit storage capability, this array architecture is suitable to build nanocrystal memories with very high integration density.

To estimate the effect of asymmetrical nanocrystal charging on device I-V characteristics, 2D device simulation, based on the split-gate MOSFET shown in FIG. 21(b), was carried out using the device simulator ATLAS. In the simulated device, the two side gates 202 and 206 represent the portions of nanocrystals that can be charged by CHI, and these represent Bits 1 and 2 of FIG. 21(a). To simulate the asymmetrical charging effect, the gate corresponding to the charged nanocrystals is biased lower than the middle gate 204, with a fixed offset. Devices with various channel and side-gate lengths are simulated to study the scalability of this effect. Table III lists the parameters of two selected devices.

TABLE III

Device parameters used for simulation
of the asymmetrical charging effect

| | $L_{EFF}$ | $N_{SUB}$ | $N_{S/D}$ | $T_{OX}$ | $L_{G1} = L_{G3}$ | $T_G$ |
|---|---|---|---|---|---|---|
| Device 1 | 2 μm | $10^{17}$ cm$^{-3}$ | $10^{20}$ cm$^{-3}$ | 6 nm | 0.2 μm | 4 nm |
| Device 2 | 0.1 μm | $10^{18}$ cm$^{-3}$ | $10^{20}$ cm$^{-3}$ | 2 nm | 15 nm | 2 nm |

Figure 22A:
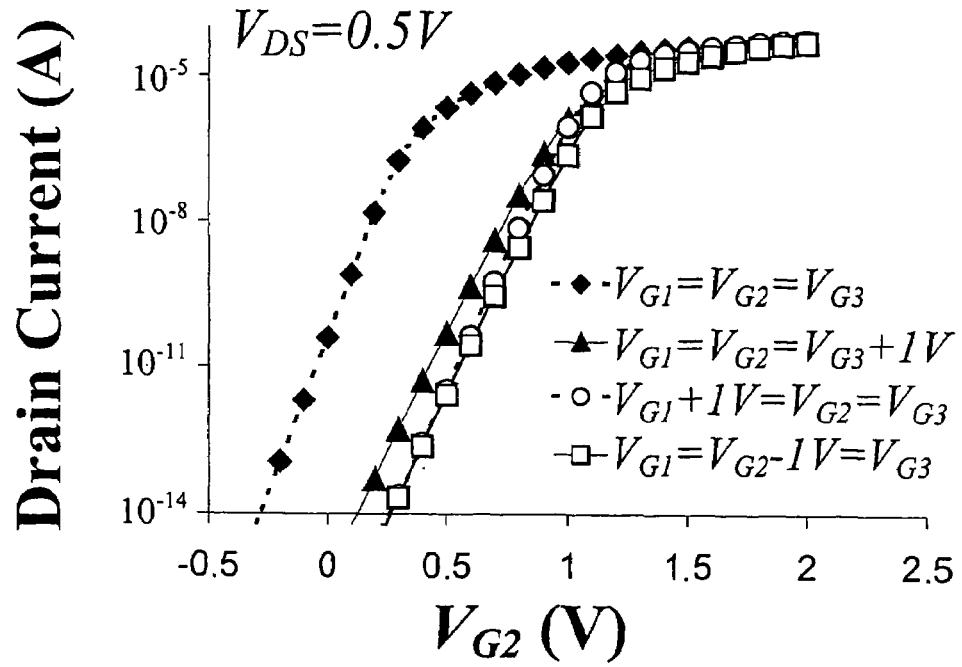
FIGS. 22(*a*) and 22(*b*) illustrate simulated I-V characteristics of device 1 in Table III with different bias combinations, wherein $V_{G1}=V_{G2}=V_{G3}$ represents uncharged floating gate; $V_{G1}=V_{G2}=V_{G3}+1V$ represents drain side charging; $V_{G1}+1V=V_{G2}=V_{G3}$ represents source side charging; and $V_{G1}=V_{G2}-1V=V_{G3}$ represents the case that both sides are charged.
Figure 22B:
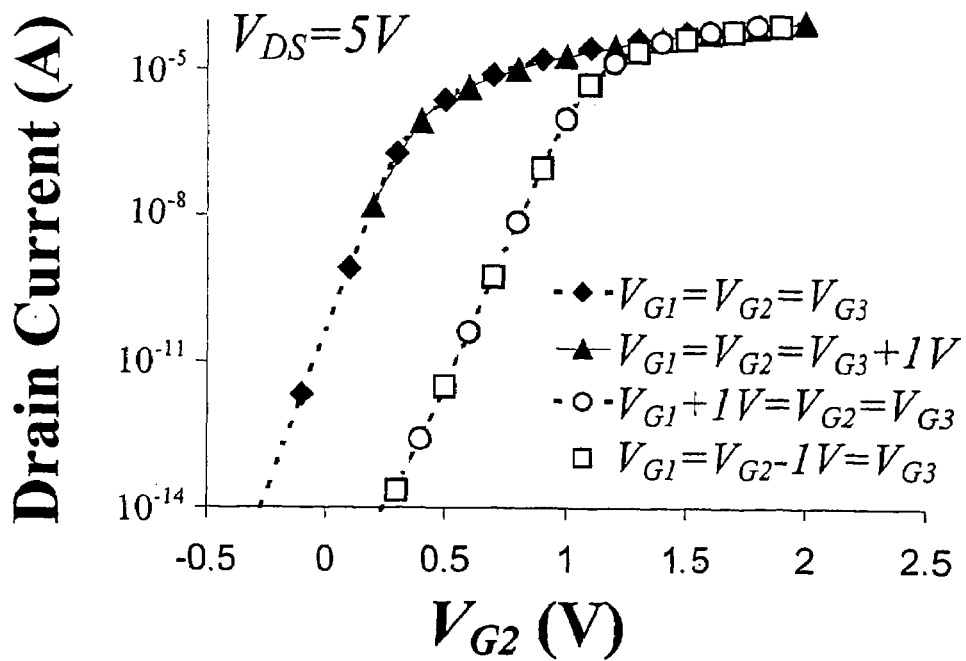

FIGS. 22(a) and 22(b) show the simulated I-V characteristics of device 1 in Table III with various bias conditions corresponding to all the possible charging configurations in a nanocrystal memory device with CHI programming. The figures illustrates that, while charges at both the source and the drain sides produce similar threshold voltage shifts under low $V_{DS}$ (FIG. 22(a)), asymmetric charging can generate a significant asymmetry in device I-V characteristics when a large $V_{DS}$ is applied (FIG. 22(b)), thus enabling 2-bit-per-cell memory operation. The physical operations are illustrated as the following.

Under low $V_{DS}$, the asymmetry effect is minimal because in this condition the surface potential ΦS is almost exclusively controlled by the gate. Even though different nanocrystal charging patterns (source side or drain side) produce a different $\Phi_S$ distribution along the channel, the effective barrier height seen from the source will be virtually the same. In the subthreshold regime, the drain current is more sensitive to the barrier height than the barrier peak location. Therefore, a similar threshold voltage is obtained whether the charged nanocrystals are located at the source side or at the drain side. With a large $V_{DS}$, however, the surface potential $\Phi_S$ close to the drain will be strongly influenced by the drain bias as well. In the extreme case, the lateral electrical field generated by the drain bias can be so strong that the charges in the drain side nanocrystals are completely screened and $\Phi_S$ close to the drain is solely determined by the drain bias. In this case, only charges in the source side nanocrystals can generate a threshold voltage shift and charges in the drain side nanocrystals will have virtually no effect on the drain current.

Figure 23A:
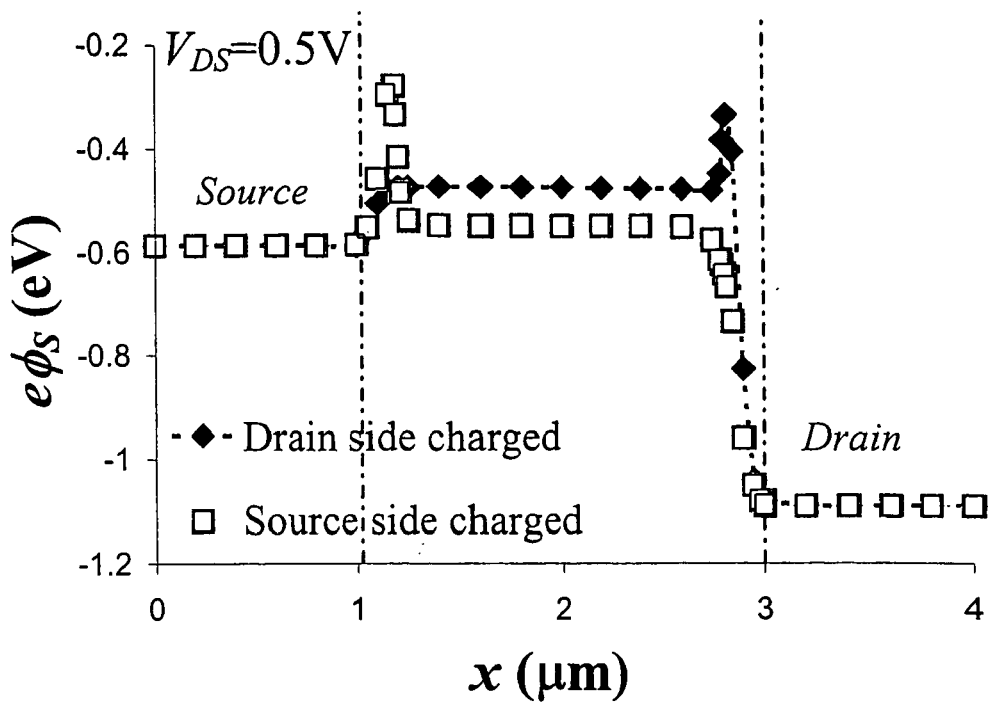
FIGS. 23(*a*) and 23(*b*) illustrate simulated surface potential distributions of device 1 in Table III under various charging and biasing conditions, the simulations being performed with the same middle gate bias $V_{G2}=0.5V$.
Figure 23B:
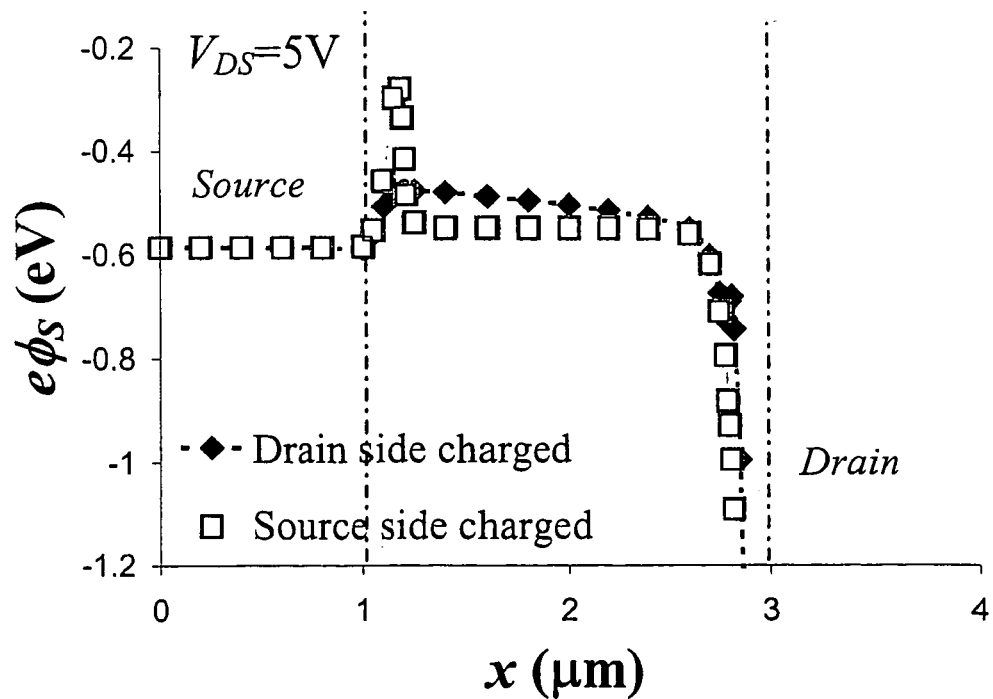

The above discussion is corroborated by the simulated $\Phi_S$ distributions shown in FIGS. 23(a) and 23(b). It can be seen that, when the drain bias is small (FIG. 23(a)), the charged nanocrystals can always create an effective barrier to block current transfer, no matter at which side they are located. Under large drain bias (FIG. 23(b)), on the other hand, the charges in the drain side nanocrystals are strongly screened by drain-induced barrier lowering (DIBL) and are thus unable to affect the current while the source side charging remains effective.

Figure 24A:
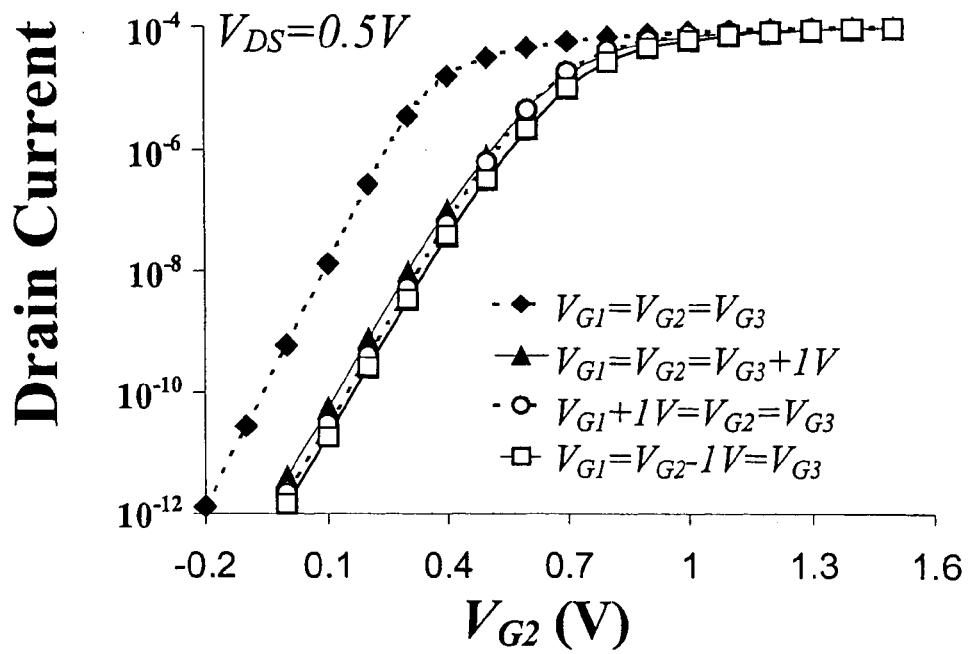
FIGS. 24(*a*) and 24(*b*) illustrate simulated I-V characteristics of device 2 in Table III with the same bias combinations as those in FIGS. 22(*a*) and 22(*b*)
Figure 24B:
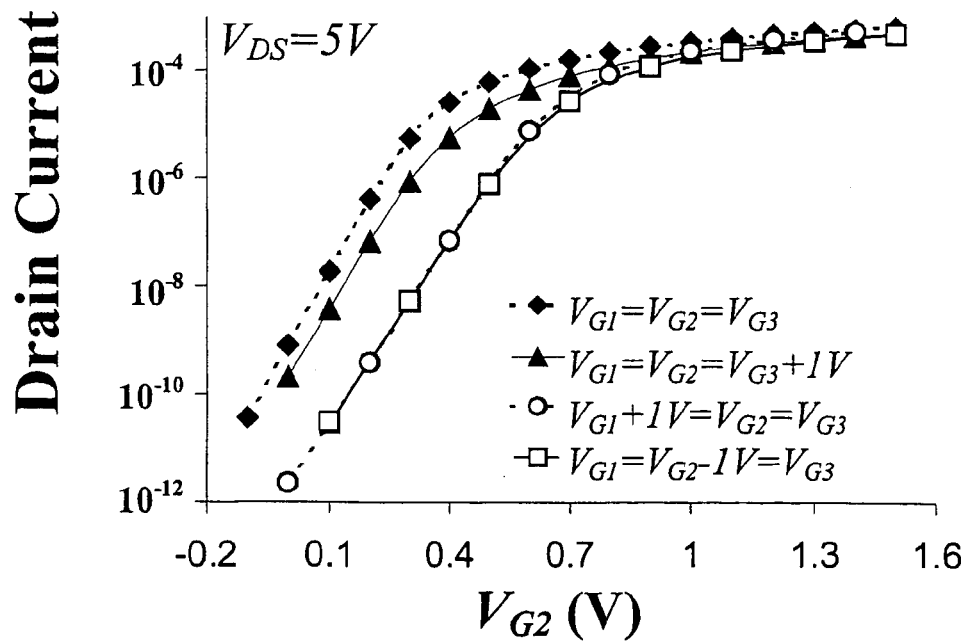

FIGS. 24(a) and 24(b) illustrate the simulated I-V characteristics of device 2 in Table III. It can be seen that the asymmetrical behavior observed for device 1 (FIGS. 23(a) and 23(b)) holds true with short channel devices down to 0.1 μm in channel length. A 15 nm wide strip of charged nanocrystals is enough to generate a substantial memory effect. Therefore, this effect can be utilized to build ultra-high density, multibit, single-transistor memory cells in the deep sub-micron regime.

Based on the above simulation results, it is possible to achieve 2-bit per cell storage with nanocrystal memory devices, in which a simple source/drain reversal can be used to address the second bit stored in a cell. The only requirement is that the read operation has to be performed with a relatively large $V_{DS}$ to guarantee successful readout. While this bias condition may raise a concern of increased disturbance of the drain during reading, such disturbances can be minimized by optimizing the channel doping profiles and carefully choosing the $V_{G,READ}$ and $V_{D,READ}$. Table IV summarizes the bias configurations used to read and write the two bits stored in a single cell.

TABLE IV

Bias configurations for independent addressing
of the two bits stored in a single cell

| | READ | | | WRITE | | |
|---|---|---|---|---|---|---|
| | $V_G$ | $V_1$ | $V_2$ | $V_G$ | $V_1$ | $V_2$ |
| Bit-1 | $V_{G,READ}$ | GND | $V_{D,READ}$ | $V_{G,WRITE}$ | $V_{D,WRITE}$ | GND |
| Bit-2 | $V_{G,READ}$ | $V_{D,READ}$ | GND | $V_{G,WRITE}$ | GND | $V_{D,WRITE}$ |

Figure 25A:
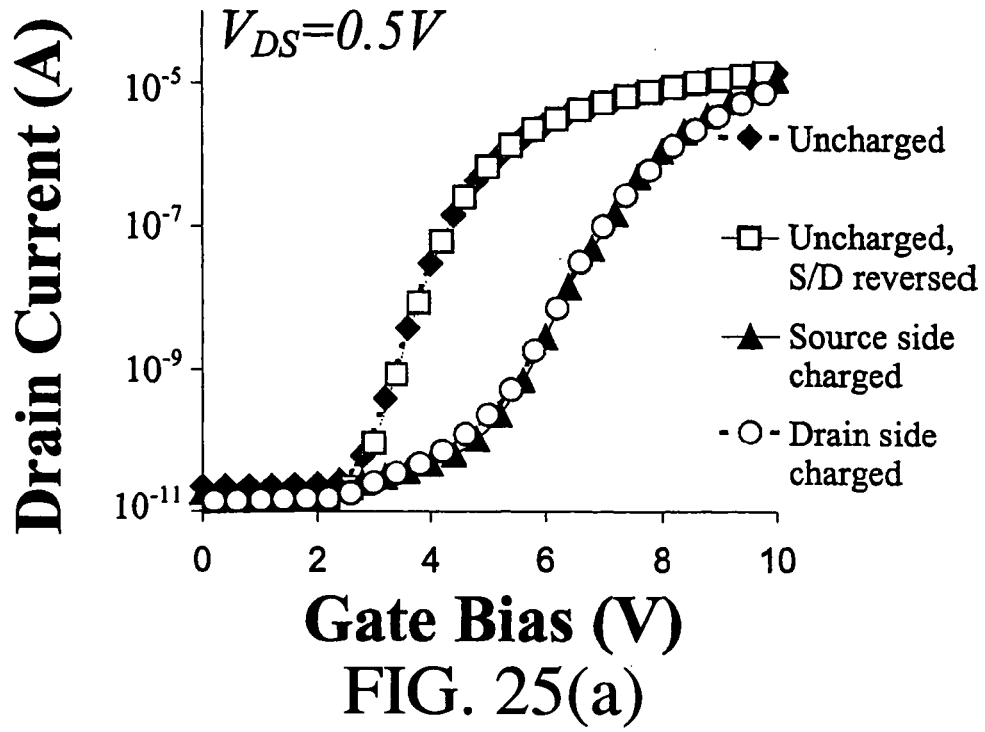
FIGS. 25(*a*) and 25(*b*) illustrate asymmetrical I-V characteristics experimentally observed with an Ag nanocrystal memory device, the size of the device being W/L=3 μm/9 μm and the CHI being performed at $V_{GS}=10V$ and $|V_{DS}|=7V$.
Figure 25B:
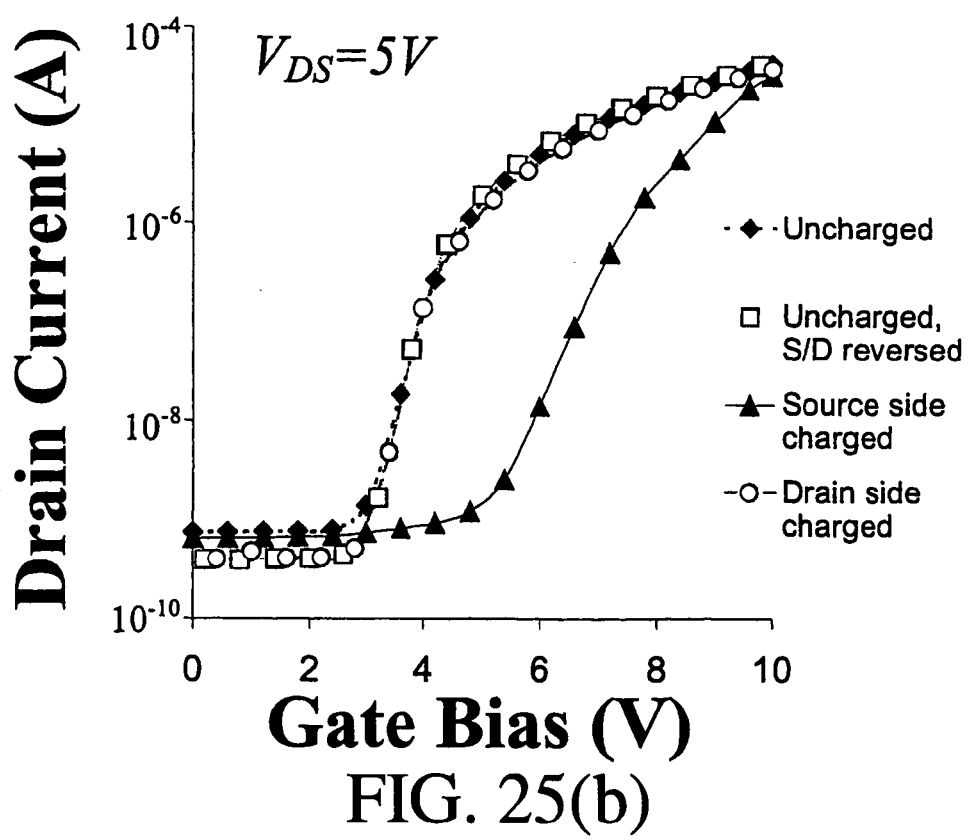

To validate the concept of 2-bit-per-cell storage, measurements corresponding to the simulations were performed, with results shown in FIGS. 25(a) and 25(b). The device measured in these figures contained Ag nanocrystals (the same behavior can also be observed in devices with Au or Pt nanocrystals) and CHI was performed with $V_{GS}$=10V and $|V_{DS}|$=7V. The I-V characteristics shown in FIGS. 25(a) and (b) agree with the simulation results very well.

Before CHI, the device I-V characteristic is symmetric. After one side of the nanocrystals are charged by CHI, small $V_{DS}$ (FIG. 25(a)) still produces symmetric I-V characteristics with a shift in threshold voltage, while a large asymmetry in device I-V characteristics can be observed under large $V_{DS}$ (FIG. 25(b)), which can be used to independently address two bits stored in a single transistor device. However, to guarantee successful 2-bit-per-cell storage, the write operation has to be properly controlled.

Figure 26A:
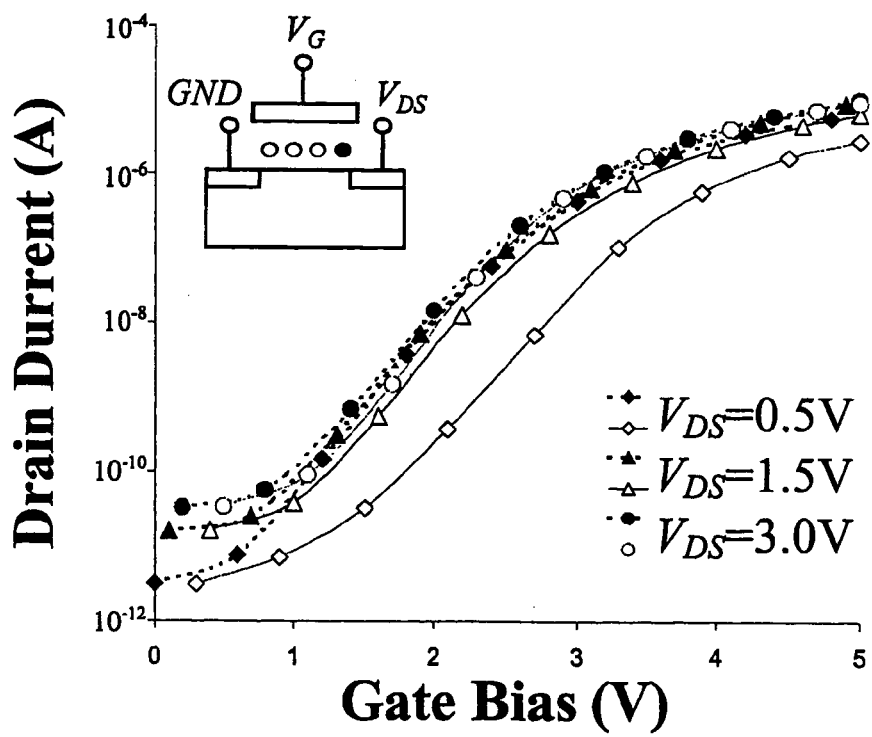
FIGS. 26(*a*) and 26(*b*) illustrate an overprogramming problem experimentally observed in 2-bit-per cell nanocrystal memories, wherein devices have W/L=3 μm/4 μm, the "good cell" of FIG. 26(*a*) being written with $V_{DS}=7V$, $V_{GS}=10V$; the "overprogrammed cell" of FIG. 26(*b*) being written with $V_{DS}=9V$, $V_{GS}=12$, and wherein the solid symbols represent the I-V curves before CHI, and the hollow symbols represent the I-V curves after CHI.
Figure 26B:
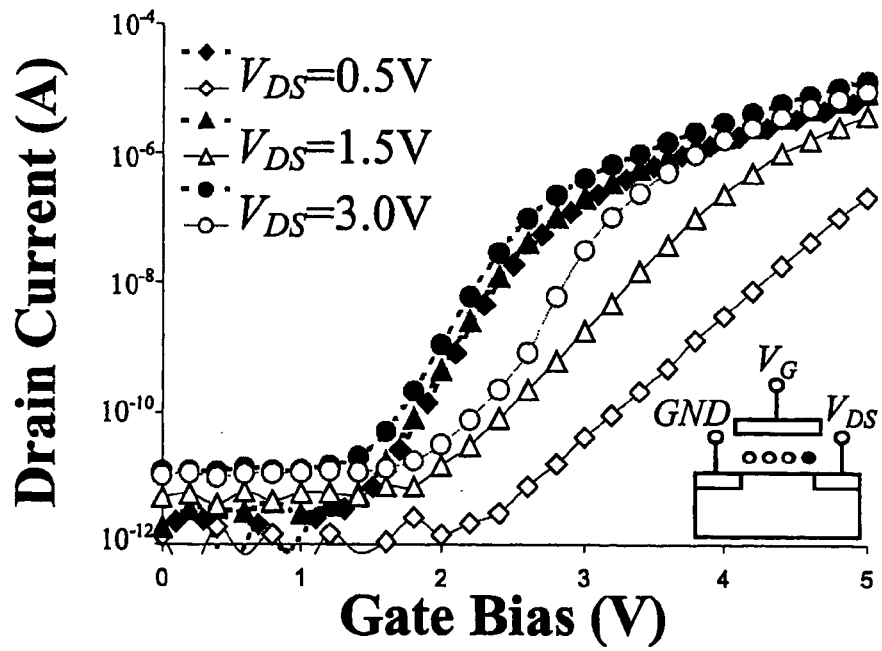

If a large portion of the nanocrystals is charged during writing, interference between the two bits may occur. In this situation, the drain bias cannot fully screen out the charge in the drain-side nanocrystals and the source-side bit cannot be independently accessed. FIGS. 26(a) and 26(b) compare the I-V characteristic of an over programmed cell (FIG. 26(b)) with that of a good cell (FIG. 26(a)). The data shown are the read-out current when accessing the left bit (unprogrammed) before and after the right bit is programmed. It can be seen that, for the good cell, the left bit can be accessed with $V_{DS}$=1.5V without interference from the right bit, while for the over programmed cell even at $V_{DS}$=5V the charges stored in the drain-side nanocrystals can still cause appreciable threshold voltage shift, thus causing errors in the readout of the left bit. To avoid this problem, $V_{DS}/V_{GS}$ and the duration for the write operation need to be carefully selected, or a write-verify scheme needs to be adopted.

When metal is used on top of a thin gate oxide, contamination of the channel by metal penetrating through the oxide is usually a concern. In metal-nanocrystal memory devices, however, this problem is less severe because the nanocrystals are formed through a self-assembly process. Self-assembly by its very nature produces thermally and chemically stable structures, so any process involving breaking the self-assembled geometry (e.g., metal atoms leaving nanocrystals and penetrating into the channel) is less likely to happen.

Figure 27:
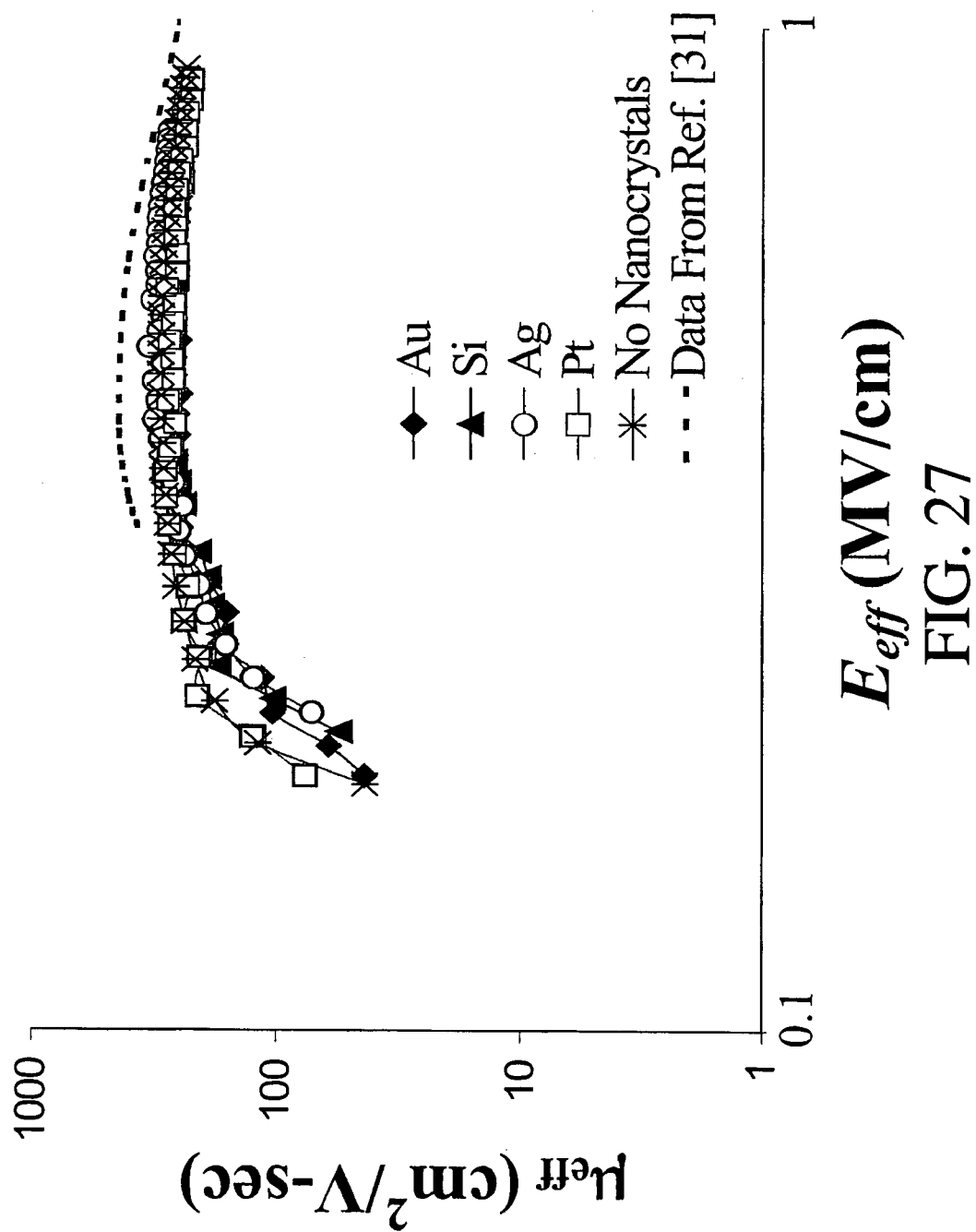
FIG. 27 illustrates the effective mobility extracted from devices with different nanocrystals.

To monitor the possible channel contamination, both I-V and C-V measurements were carried out for the nanocrystal memory devices. FIG. 27 illustrates the extracted effective carrier mobility for devices with different nanocrystals as well as MOSFETs without nanocrystals. Within experimental resolution, extracted mobilities for different devices fall on the same curve and show little deviation from that of a simple MOSFET without nanocrystals. Also shown in the figure are mobility data for devices with similar channel doping. The mobilities extracted from the present devices are about 30% lower and show a smaller $E_{eff}$ dependence in the mid and high field regions. This discrepancy can be explained by the stronger scattering from the interface states in the present devices. Because no passivation annealing was performed during device fabrication because of a concern about control gate adhesion, the present devices have relatively high density of the interface states (mid $10_{11}$ cm$_{-2}$eV$_{-1}$). The extra scattering from the interface states will reduce the effective mobility and produce a weaker $E_{eff}$ dependence, because on the one hand as $E_{eff}$ becomes larger, electrons are closer to the interface, thus experiencing stronger scattering, while on the other hand electron concentration becomes higher, thus also producing stronger screening.

FIGS. 28(a) to 28(d) show the deep depletion high frequency C-V measurements on MOS capacitors of 200 um in diameter at different ramp rates for minority carrier lifetime ($\tau_0$) estimation for Si, Ag, Au and Pt nanocrystals. Deep depletion is readily observable for all the devices with 1 V/sec ramp rate. From the difference in depletion capacitance under a linear sweep and from that measured quasi-statically, the minority carrier lifetime can be extracted. Table V lists the extracted minority carrier lifetime for different devices. Lifetimes ranging from 0.02–0.12 μs are obtained, without apparent differences among the different samples.

TABLE V

Extracted minority carrier lifetime from devices with different nanocrystals

| | Samples | | | |
|---|---|---|---|---|
| Au | Ag | Pt | Si | No Nanocrystals |
| τ(μsec) 0.02–0.07 | 0.04–0.06 | 0.06–0.12 | 0.03–0.05 | 0.04–0.1 |

Both the I-V and C-V measurements suggest that the channel is free from metal contamination and support the hypothesis that the herein-disclosed self-assembly process helps alleviate the contamination problem.

As described above, metal nanocrystal memories have the potential of achieving fast write/erase and long retention times simultaneously. Depending on the applications (non-volatile or dynamic), metal nanocrystal memories can be engineered to work either in a direct tunneling regime or in the F-N tunneling regime. Work function engineering may be used, as the design principle for such devices. A fabrication process utilizing self-assembled metal nanocrystals and the characteristics of Ag, Au, and Pt nanocrystal memory devices operating in the F-N tunneling regime have been described. These devices can be programmed by CHI and erased by UV exposure or F-N tunneling, and a retention time up to $10_6$ and 2-bit-per-cell storage capability have been described. The extracted inversion channel mobility and minority carrier lifetime suggest minimal contamination from the metal nanocrystals.

Although the invention has been described in terms of preferred embodiments, it will be understood that numerous variations and modifications may be made, without departing from the true spirit and scope thereof, as set out in the following claims.

What is claimed is:

1. A multibit storage cell, comprising:
   a semiconductor substrate having source and drain regions separated by a channel region;
   an insulator material formed on said substrate and having a plurality of metal nanocrystals embedded therein, said metal nanocrystals including a first portion forming a first storage element located in the region of a source side junction with said channel and a second portion forming a second storage element located in the region of a drain side junction with said channel;
   a gate electrode on said insulator material;
   a control layer formed in said insulator material between said gate electrode and said metal nanocrystals;
   a tunnel layer formed between said metal nanocrystals and said substrate; and
   bias voltages connected to said source and drain regions to produce asymmetric charging of said nanocrystals, wherein said metal nanocrystals are formed from a metal that is selected to have a work function value which affects transport of charge through said insulating material such that a first, low potential barrier is formed across said tunnel oxide during writing to said storage elements, and a second, higher potential barrier is formed across said tunnel oxide during retention of charge in said storage elements.

2. The storage cell of claim 1, wherein said gate electrode overlies said nanocrystals and said channel.

3. The storage cell of claim 1, wherein said bias voltages are connected to write and to read multiple bits of data in said storage elements.

4. The storage cell of claim 3, wherein said bias voltages include write voltages selected to independently write data to said first and second storage elements.

5. The storage cell of claim 3, wherein said bias voltages include read voltages selected to independently read data from said first and second storage elements.

6. The storage cell of claim 3, wherein said bias voltages include first and second write voltages connectable to said source and drain to write information to said first storage element, and being reversible to write information to said second storage element.

7. The storage cell of claim 5, wherein said bias voltages further include first and second read voltages connectable to said source and drain to read information written to said first storage element, and reversible to read information written to said second storage element.

* * * * *